(12) United States Patent
Wood et al.

(10) Patent No.: US 10,340,410 B2
(45) Date of Patent: Jul. 2, 2019

(54) OPTOCOUPLER FOR THE CONTROL OF HIGH VOLTAGE

(71) Applicant: Harris Corporation, Melbourne, FL (US)

(72) Inventors: Stuart D. Wood, Macedon, NY (US); Steven M. DeSmitt, Fairport, NY (US); Eugene G. Olczak, Pittsford, NY (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

(21) Appl. No.: 16/137,760

(22) Filed: Sep. 21, 2018

(65) Prior Publication Data

US 2019/0044020 A1  Feb. 7, 2019

Related U.S. Application Data

(62) Division of application No. 15/660,008, filed on Jul. 26, 2017, now Pat. No. 10,128,400.

(51) Int. Cl.

| | |
|---|---|
| *H01L 31/18* | (2006.01) |
| *H01L 31/147* | (2006.01) |
| *H01L 31/0232* | (2014.01) |
| *H01L 31/02* | (2006.01) |
| *H01L 31/0203* | (2014.01) |

(52) U.S. Cl.
CPC ........ *H01L 31/147* (2013.01); *H01L 31/0203* (2013.01); *H01L 31/02005* (2013.01); *H01L 31/02325* (2013.01); *H01L 31/1876* (2013.01)

(58) Field of Classification Search
CPC .......... H01L 31/02005; H01L 31/0203; H01L 31/02325; H01L 31/147; H01L 31/167; H01L 31/173; H01L 31/18; H01L 31/186; H01L 31/1867; H01L 31/1876
See application file for complete search history.

(56) References Cited

U.S. PATENT DOCUMENTS

| | | | | |
|---|---|---|---|---|
| 4,047,045 A | * | 9/1977 | Paxton, Jr. ............ | H01L 31/167 250/551 |
| 4,240,088 A | * | 12/1980 | Myers ................... | H01L 31/167 250/551 |
| 2004/0149995 A1 | * | 8/2004 | Shoji ....................... | H01L 31/16 257/81 |
| 2013/0181232 A1 | | 7/2013 | Jeromerajan et al. | |
| 2014/0212085 A1 | | 7/2014 | Margaritis | |
| 2018/0190855 A1 | | 7/2018 | Male | |

* cited by examiner

*Primary Examiner* — Cuong Q Nguyen
(74) *Attorney, Agent, or Firm* — RatnerPrestia

(57) ABSTRACT

The present invention relates to an optocoupler including a light source having a body and electrical leads, a light detector having a diode stack a metal end cap and electrical leads, and an optical cavity including optically transparent material at least partially covering the body of the light source and the diode stack of the light detector. Also included is a reflective layer including optically reflective material surrounding the optical cavity. The electrical leads of the light source, the metal end cap and the electrical leads of the light detector protrude from the optical cavity and the reflective layer.

6 Claims, 24 Drawing Sheets

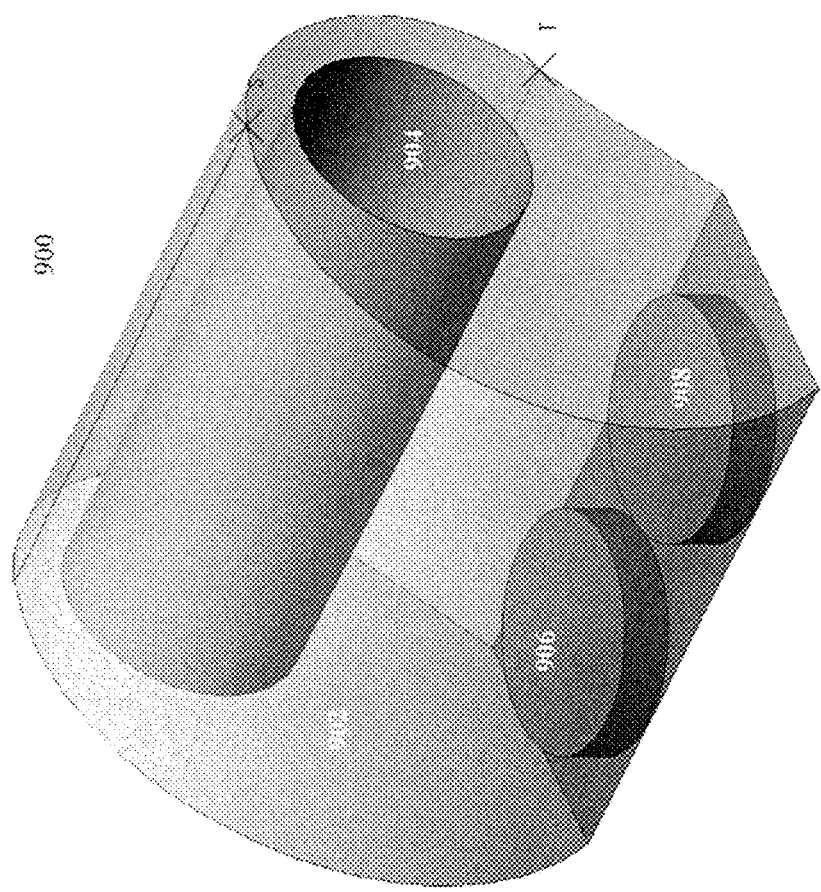

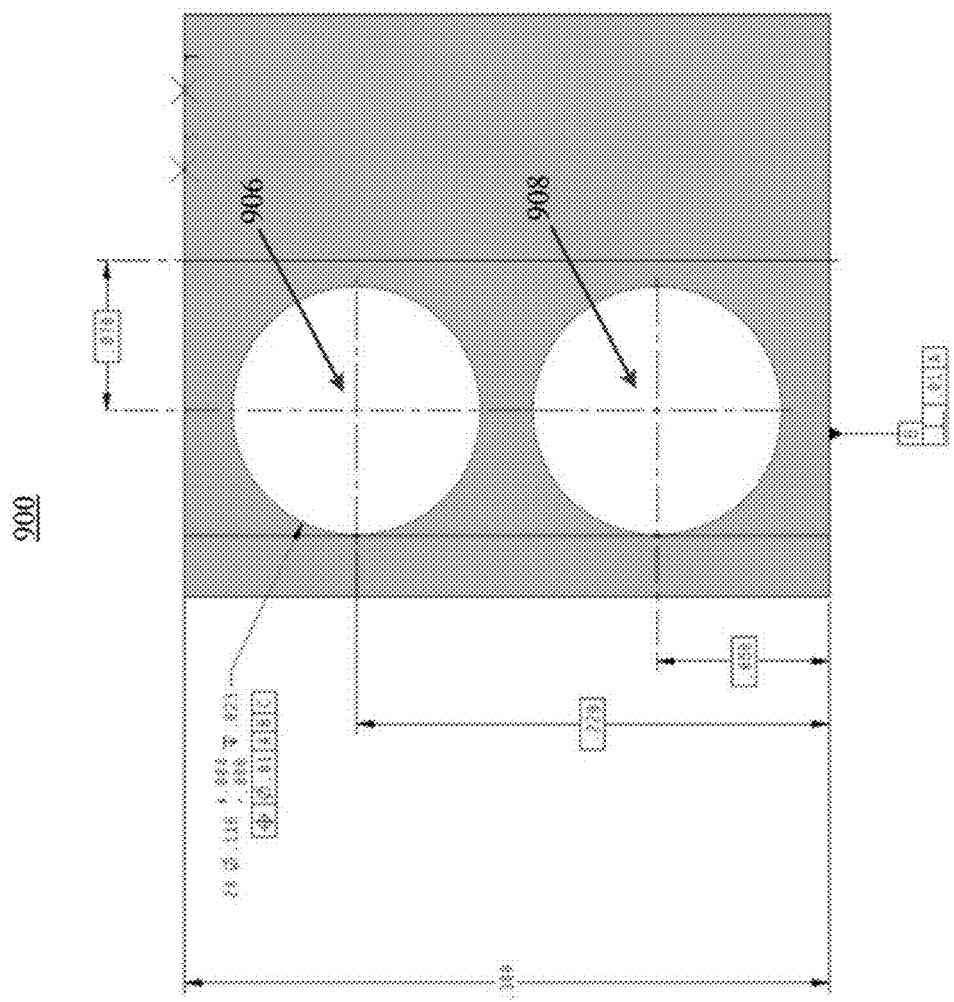

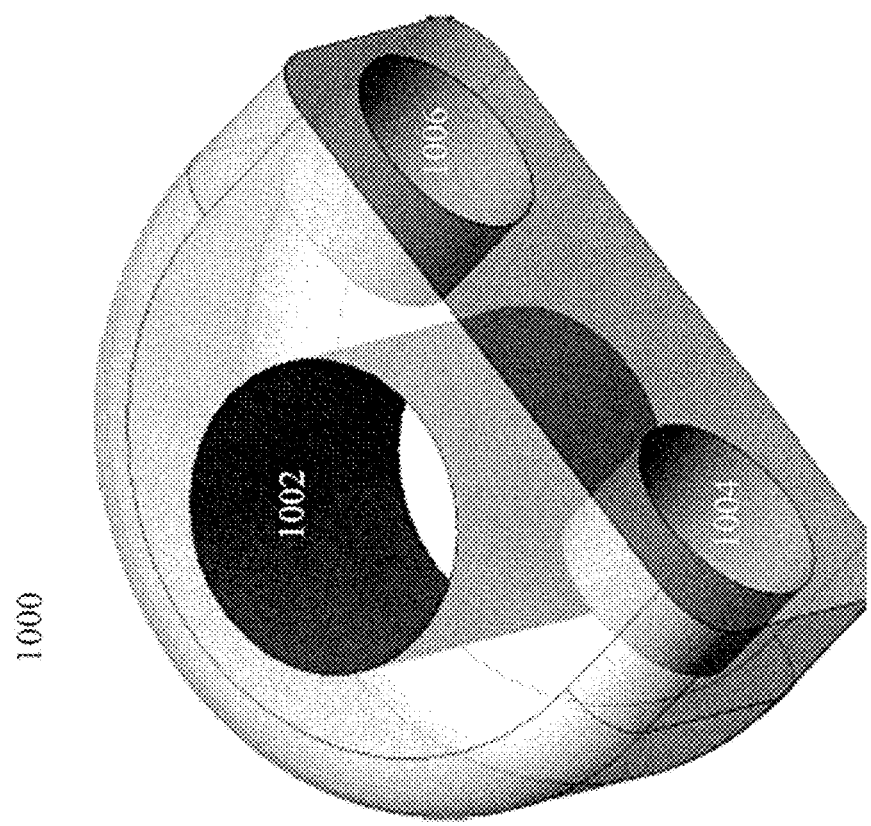

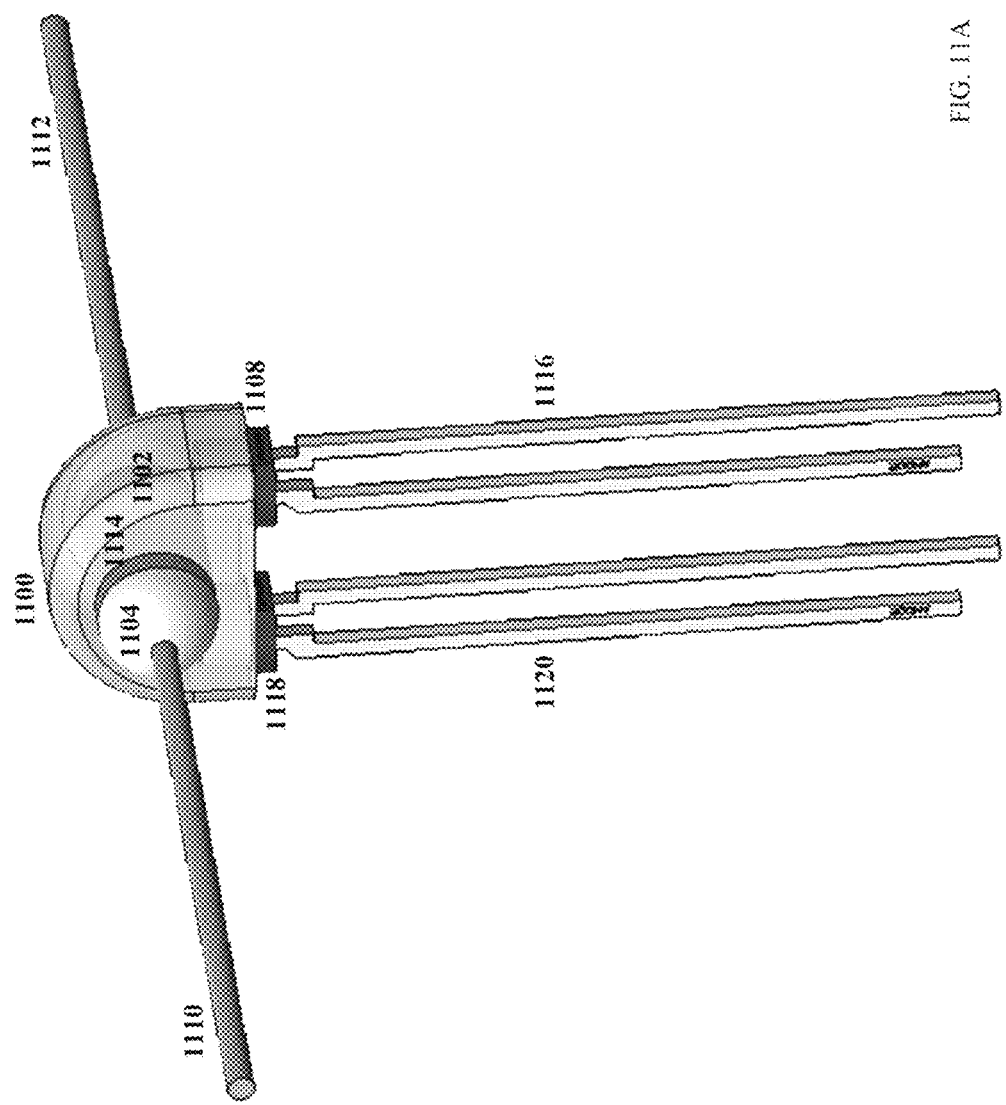

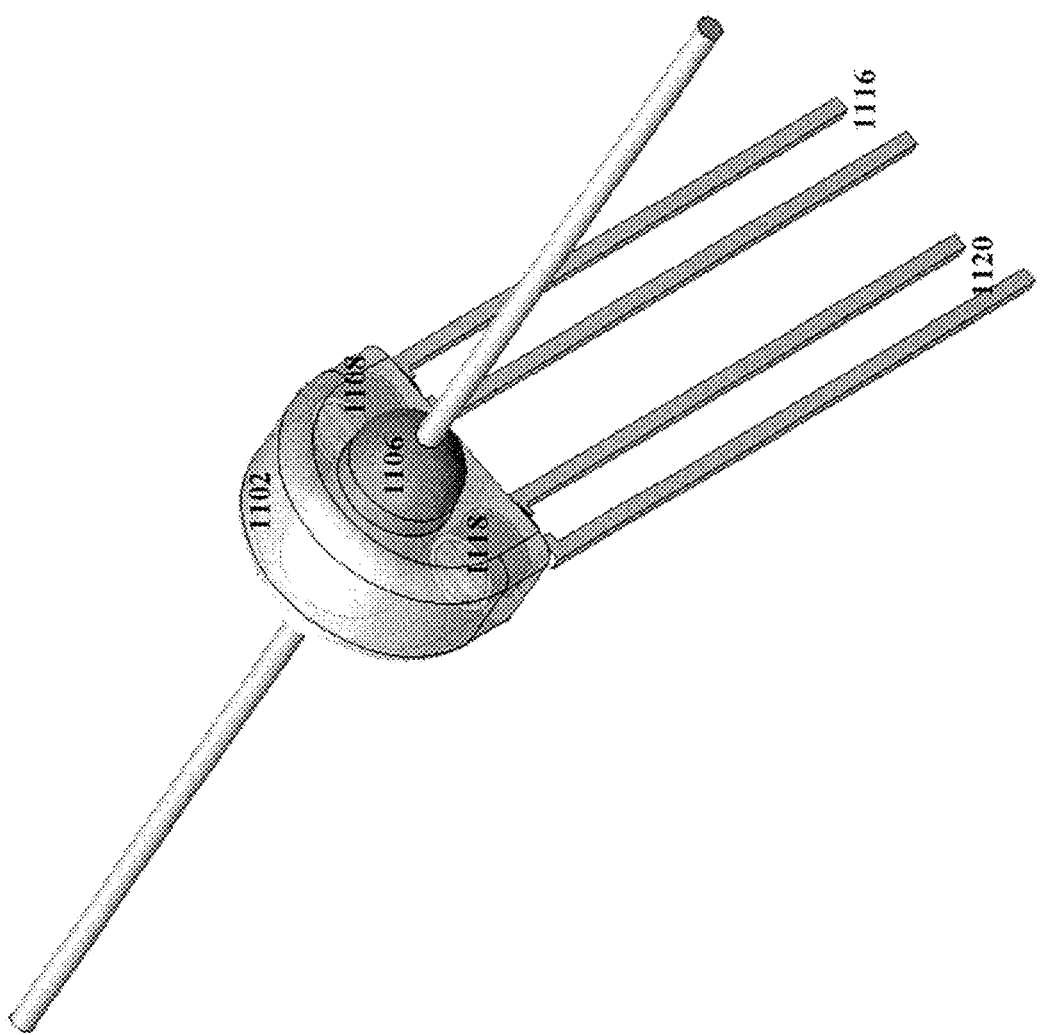

OPTOCOUPLER FOR THE CONTROL OF HIGH VOLTAGE

CROSS REFERENCE TO RELATED APPLICATION

This application is a U.S. Divisional Application which claims priority to U.S. patent application Ser. No. 15/660,008, filed Jul. 26, 2017, the contents of such application being incorporated by reference herein.

FIELD

The present invention relates to an optocoupler for the control of high voltage.

BACKGROUND

Performance (e.g. efficiency) of an optocoupler is typically evaluated based on current transfer ratio (CTR). CTR is essentially a ratio of output current to input current expressed as a percentage. It is well known that as the voltage rating of the optocoupler increases, CTR decreases. State-of-the-art optocouplers are able to achieve respectable CTRs at low voltages. However, once rated operating voltage reaches a certain level (e.g. above 10 KV), the CTR of these state-of-the-art optocouplers quickly drops to an unacceptable level (e.g. CTR<0.5%). This is attributed to inefficient optical coupling and packaging of these devices.

SUMMARY

An embodiment includes an optocoupler. The optocoupler includes a light source having a body and electrical leads, a light detector having a diode stack a metal end cap and electrical leads, and an optical cavity including optically transparent material at least partially covering the body of the light source and the diode stack of the light detector. Also included is a reflective layer including optically reflective material surrounding the optical cavity. The electrical leads of the light source, the metal end cap and the electrical leads of the light detector protrude from the optical cavity and the reflective layer.

Another embodiment includes a method of manufacturing an optocoupler. The method includes positioning a body of a light source into a first mold such that electrical leads of the light source protrude from the first mold, positioning a diode stack of a light detector into the first mold such that metal end caps and electrical leads of the light detector protrude from the first mold, pouring optically transparent material into the first mold to create an optical cavity enclosing the body of the light source and the diode stack of the light detector, and disposing a coating of optically reflective material over the optical cavity to form a reflective layer.

BRIEF DESCRIPTION OF THE FIGURES

FIG. 9A shows a perspective view illustration of an exemplary optical cavity configured with an asymmetric curved surface, according to an embodiment of the present invention.

FIG. 9C shows a bottom view illustration of the optical cavity in FIG. 9A, according to an embodiment of the present invention.

FIG. 10A shows a perspective view illustration of an exemplary optical cavity configured with a symmetric curved surface, according to an embodiment of the present invention.

FIG. 11A shows a perspective view illustration of an exemplary optocoupler, according to an embodiment of the present invention.

FIG. 11D shows another perspective view illustration of the optocoupler in FIG. 11A, according to an embodiment of the present invention.

DETAILED DESCRIPTION

Aspects of the present invention provide an optocoupler designed and manufactured for efficient use in high voltage applications in which the optocoupler may have several hundred to many thousands of volts across its output terminals. The optocoupler is designed and manufactured to increase optical efficiency when transferring light from a light source to a light detector, thereby maintaining an adequate CTR even at higher rated operating voltages (e.g. >10 KV).

Figure 1:
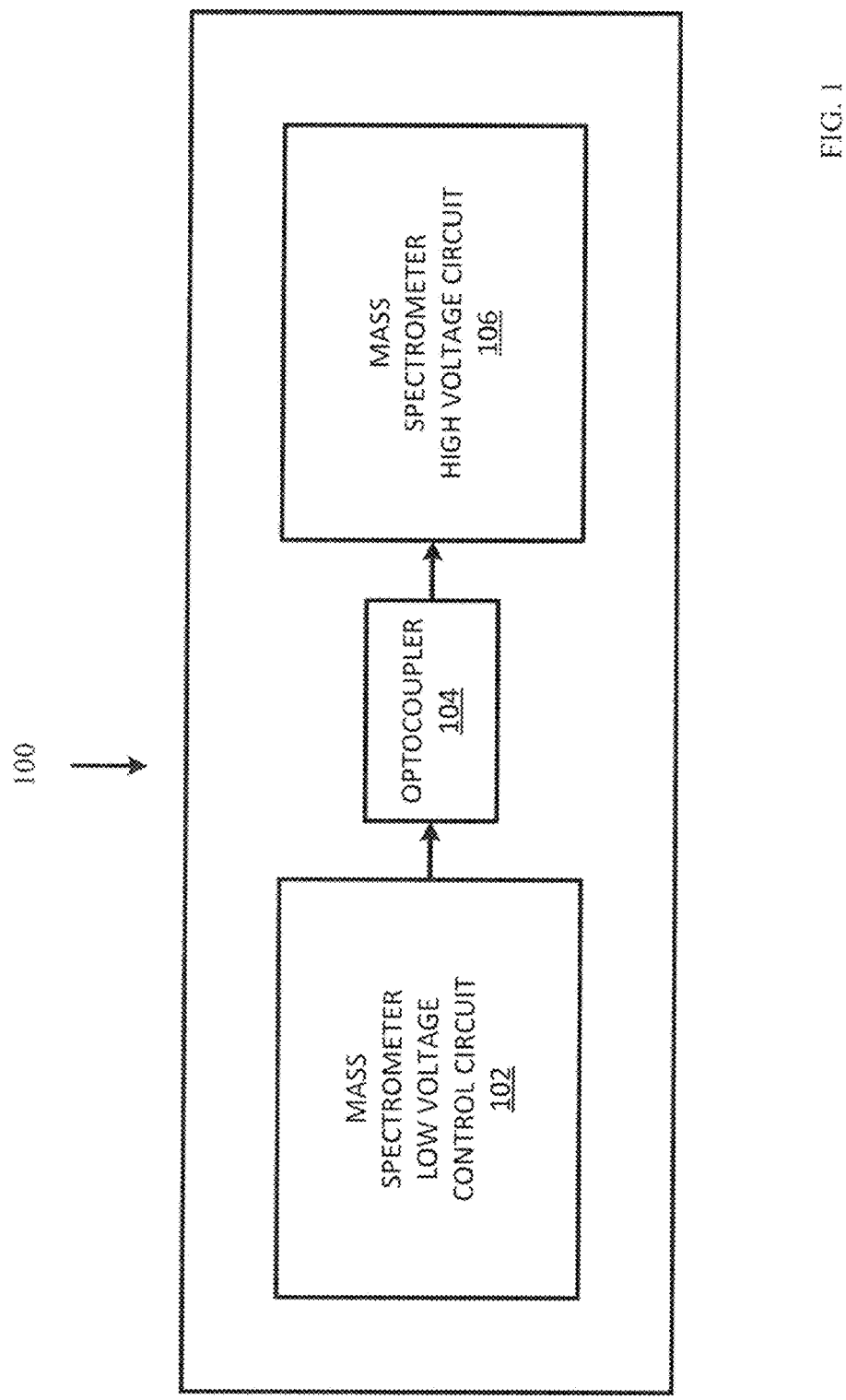
FIG. 1 is a block diagram of an exemplary mass spectrometer utilizing an optocoupler as a link between a low voltage circuit and a high voltage circuit, according to an embodiment of the present invention.

High voltage applications are common in various industries. Once such application is in mass spectrometry (i.e. the determination of mass of a sample using a mass spectrometer). In general, a mass spectrometer 100 (see FIG. 1) typically includes a low-voltage control circuit 102 having various low voltage components (not shown) for controlling the overall mass spectrometer 100 operation. These low voltage components may include memory devices, a processor, etc., as are well known to those of skill in the art. Also, included are high voltage circuit 106 having various high voltage components (not shown). These high voltage components may include an electron gun, for ionizing the sample under test, an accelerator plate, for accelerating the ionized sample, a magnet for deflecting the accelerated sample, and a detector for detecting the deflected sample, again, all of which are well known to those of skill in the art. The invention is not limited to any particular application such as a specific mass spectrometer construction or to specific low or high voltage components.

For low voltage control circuit 102 to safely control high voltage circuit 106, without damaging the low voltage components, optocoupler 104 is employed as a link between the circuits. Optocoupler 104, through an optical interaction between a light source (not shown) and a light detector (not shown), electrically isolates low voltage control circuit 102 from high voltage circuit 106, while allowing control over the high voltage (e.g. switching electrical currents on/off).

For example, during operation of the mass spectrometer, a processor (not shown) in low voltage control circuit 102, is able to control the high voltage devices (e.g. electron gun) in high voltage circuit 106, by sending control signals to optocoupler 104. These control signals are converted by the light source in optocoupler 104 into light beams. The light detector in optocoupler 104 then receives these light beams. Upon receiving the light beams, the light detector modulates the amplitude of electrical current flowing through optocoupler 104 to the high voltage circuit 106 (e.g. the light detector may be configured as a binary switch to allow or prevent current from flowing through the high voltage circuit based upon its detection or non-detection of light, or it may regulate the amount of current flowing through the high-voltage circuit based upon the amount of light detected).

One or more light sources and one or more light detectors within optocoupler 104 may be arranged in various configurations to perform optical coupling. Two examples of these configurations are shown in FIGS. 2 and 3.

Figure 2:
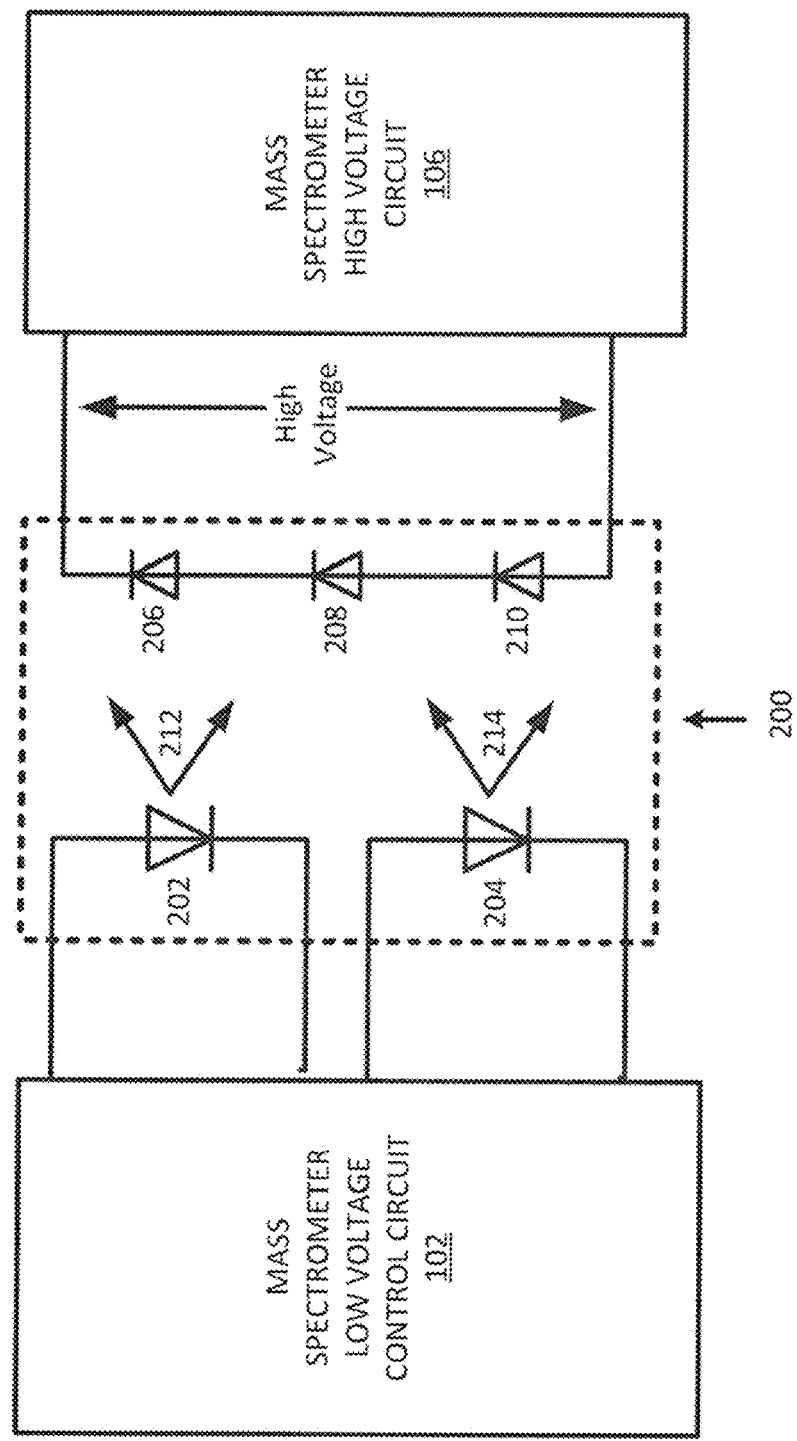
FIG. 2 is a block diagram of the mass spectrometer of FIG. 1, showing details of an exemplary optocoupler configured with LEDs on a common side of the optocoupler, according to an embodiment of the present invention.

FIG. 2 shows an example for configuring the light sources and light detectors of the optocoupler in mass spectrometer 100. In this example, optocoupler 200 includes light emitting diodes (LEDs) 202 and 204 for light sources, and photo-diodes 206, 208 and 210 for light detection and modulating electrical current flowing through the high voltage circuit. LEDs 202 and 204 in this example, are positioned on the same side of optocoupler 200 and emit light 212 and 214 respectively towards photo-diodes 206-210.

Figure 3:
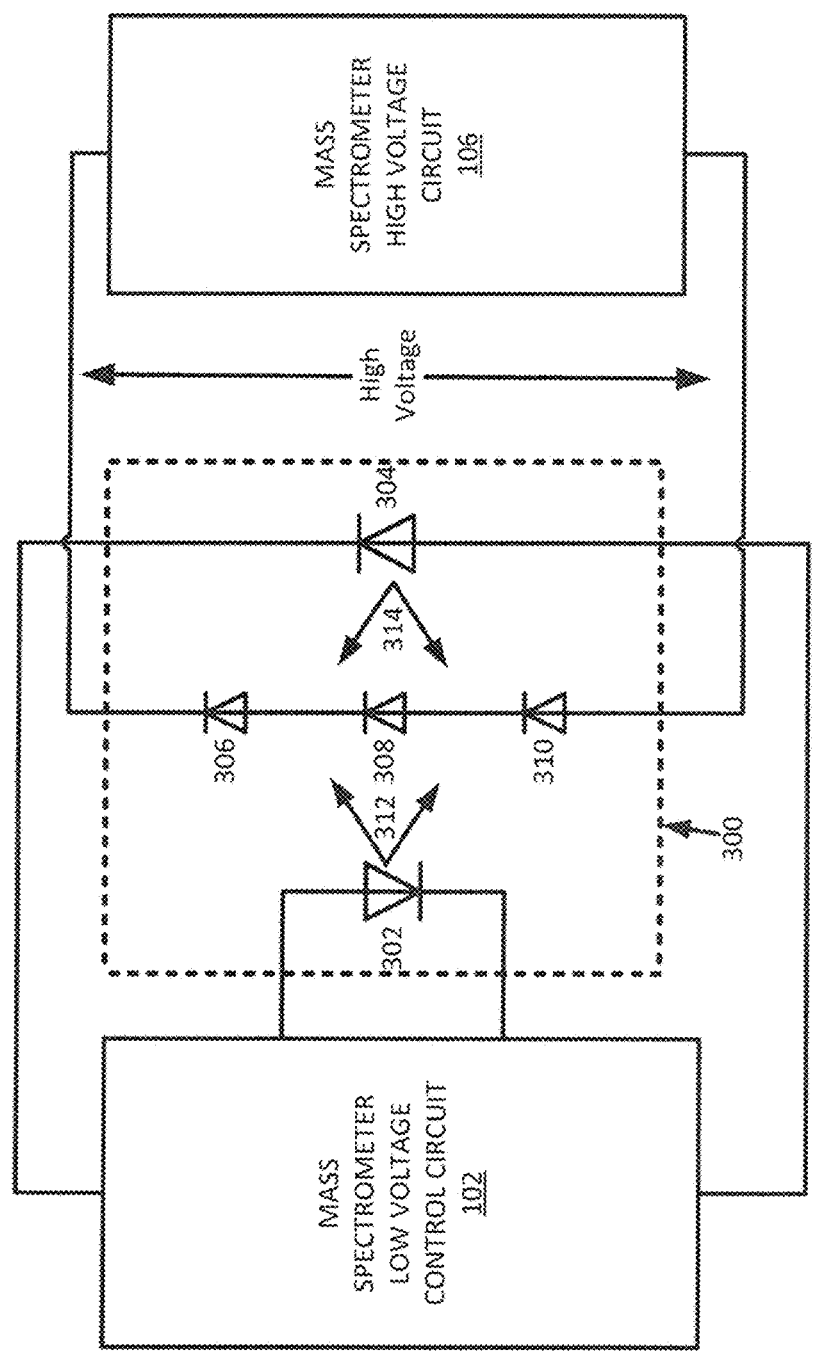
FIG. 3 is a block diagram of the mass spectrometer of FIG. 1, showing details of an exemplary optocoupler configured with LEDs on opposite sides of the optocoupler, according to an embodiment of the present invention.

FIG. 3 shows another example for configuring the light sources and light detectors of the optocoupler in mass spectrometer 100. In this example, LEDs 302 and 304 are positioned on opposite sides of photo-diodes 306, 308 and 310. LEDs 302 and 304 in this example, emit light 312 and 314 respectively towards photo-diodes 306-310 from opposite sides.

Although FIGS. 2 and 3 show two examples of positioning the LEDs with respect to the photo-diodes, it should be noted that other configurations are possible (e.g. LEDs and photo-diodes can be placed at various positions within the optocoupler to achieve optical coupling). In addition, the optocoupler is not restricted to using two LEDs and three photo-diodes. Any number of LEDs and any number of photo-diodes may also be used to produce the optocoupler. In addition, other light sources (e.g. halogen lamp) and other light detectors (e.g. photo-transistors) may be used.

Figure 4:
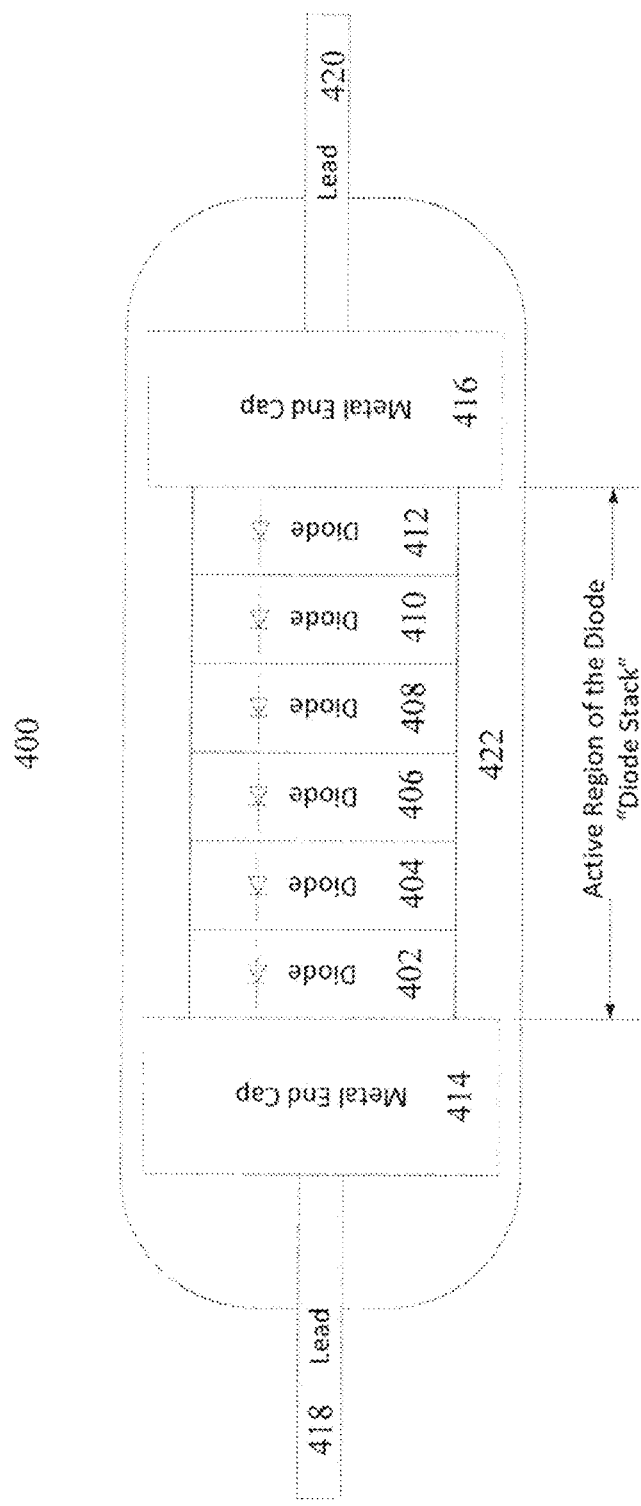
FIG. 4 is a representation of a conventional high voltage diode used as a light detector in the output of a high voltage optocoupler.

Typically, the photo-diodes are housed together in a single package. FIG. 4 shows an example construction of such a device 400. The diodes 402-412 are connected in series and are typically referred to as a diode stack. The actual number of photo-diodes in the diode stack is based on the devices voltage rating and the manufacturing process. Metal endcaps 414 and 416 are attached to the diode stack ends along with wire leads 418 and 420 to make the high voltage electrical connections. The device may or may not be encapsulated 422, to protect the structure and provide mechanical strength. Although 6 diodes are shown in FIG. 4, it is noted that any number of diodes could be used to build the stack. In addition, the diodes could have different shapes (e.g. cube, disk, etc.).

Figure 5:
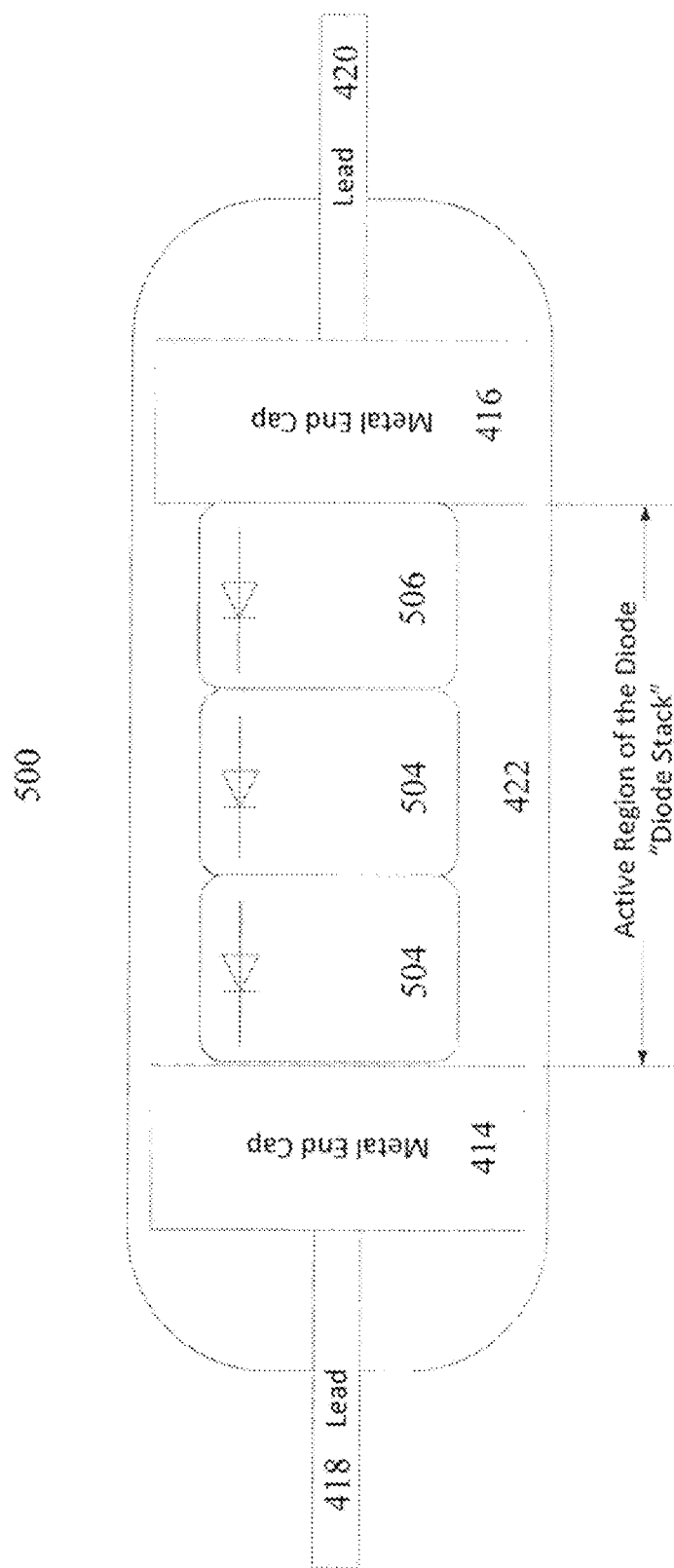
FIG. 5 is another representation of a conventional high voltage diode used as a light detector in the output of a high voltage optocoupler.

For example, FIG. 5 shows another package 500 which includes a stack of 3 diodes 502-506 which are shaped as disks. Generally, the shape of the diodes may be chosen based on the overall shape/size of the package, and the number of diodes in the stack increases as the voltage increases.

The diode stack of FIGS. 4 and 5 is the light sensing component. The other device components are used to mechanically strengthen the package and make electrical connections to the diodes in the stack. These other features do not support incoming light detection.

Figure 6:
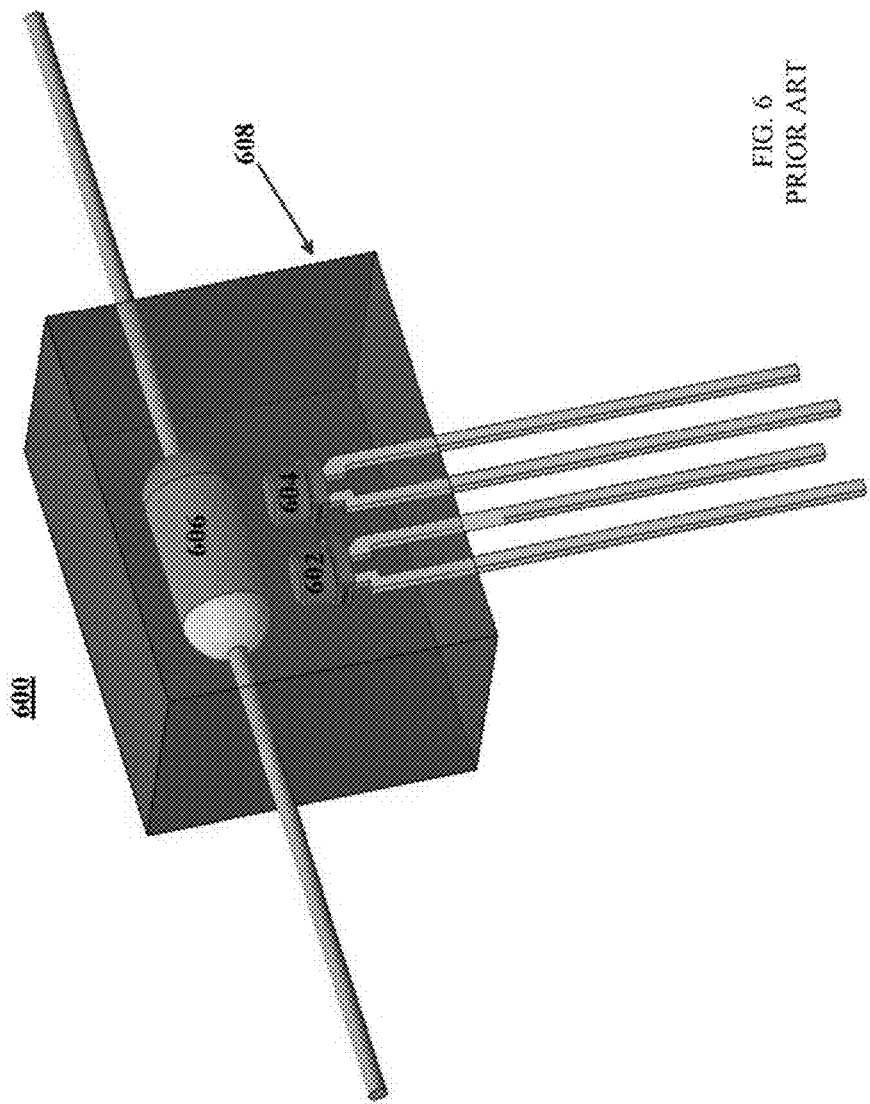
FIG. 6 is a perspective view illustration of an example of a conventional optocoupler configured with light sources on a common side optocoupler directed towards a light detector.

Once the number, position, and configuration of light sources and light detectors is decided, these components are enclosed together in an optical cavity to create the optocoupler for installation in the end device (e.g. mass spectrometer). For example, as shown in FIG. 6, optocoupler 600 includes LEDs 602 and 604 positioned on a common side of the optocoupler body. Also included is a photo-diode 606 mounted opposite of and in line with the light emitted from the LEDs 602 and 604. Essentially, the body of the photo-diodes and LEDs are enclosed in the optical cavity, while their electrical leads are positioned to protrude from the optical cavity. This configuration allows the LEDs to be electrically connected to the low voltage circuit, and the photo-diodes to be electrically connected to the high voltage circuit.

Figure 7:
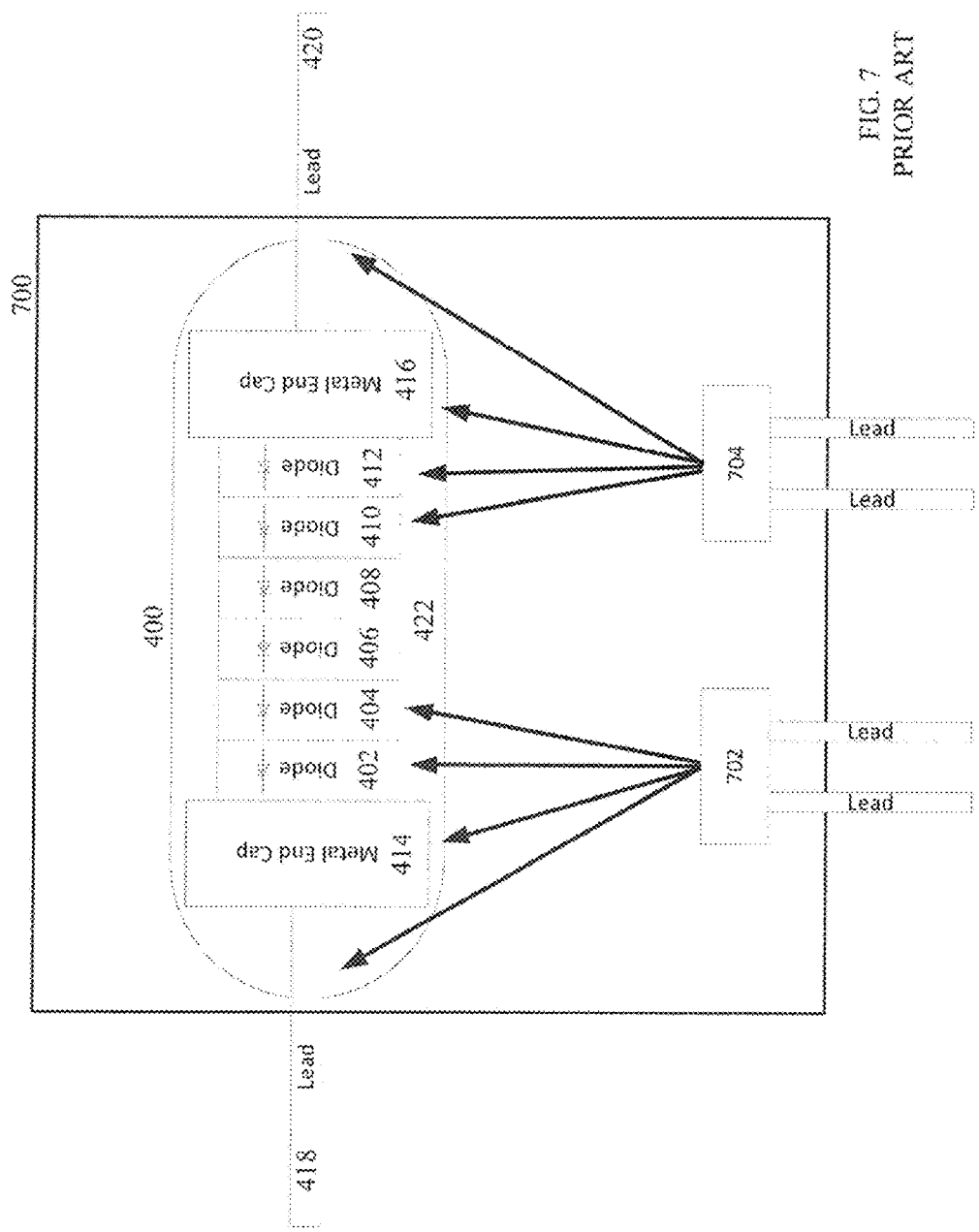
FIG. 7 is a schematic view illustration of the conventional optocoupler in FIG. 6 with light sources impinging on the light detector.

Another view of optocoupler 600 is shown in the schematic drawing of FIG. 7, where LEDs 702 and 704 are positioned on a common side of photo-diodes 402/412. These components (e.g. LEDs and photo-diodes) are then enclosed in an optical cavity 700 which is made from a transparent material allowing optical coupling between the devices.

For example, the components may be positioned relative to each other in a mold which is then filled with a material that is optically clear for the wavelength of the LED, such as but not limited to, for example, epoxy, plastics, acrylic, glass or silicon. The optical material provides a rigid structure for forming the optocoupler body, as well as an optical medium for transferring light between the LEDs and photo-diodes. This provides a configuration to securely encapsulate the components into a single device that may be used in various applications such as in the mass spectrometer. It should be noted that in this configuration, the electrical leads of the LEDs and the electrical leads (not shown) of the photo-diodes protrude from optical cavity 700 allowing for electrical connections to the low voltage and high voltage circuits respectively.

Positioning of the LEDs relative to the photo-diodes is performed, at least in part, based on the optocoupler rated operating voltage. As discussed above, operating voltages may be high (e.g. >10 KV) for certain applications. Higher rated operating voltages require LEDs to be distanced further from the photo-diodes to prevent the high voltage from jumping from the high voltage circuit to the low voltage circuit. This distance may be determined based on the optical cavity 700 material dielectric breakdown strength (i.e. the minimum applied voltage divided by electrode separation distance that results in breakdown). Specifically, for a given design operating voltage of the optocoupler (such as a maximum design operating voltage, or a maximum design operating voltage or normal operating voltage multiplied by a predetermined safety factor), the distance is chosen to be greater than the distance corresponding to the material's dielectric breakdown strength.

In addition, positioning of the LEDs relative to the photo-diodes is also performed, at least in part, based on obtaining a desired optical efficiency. In general, optical efficiency decreases with an increase in distance between the LEDs and the photo-diodes (e.g. the farther away the components are, the less efficient the optocoupler becomes). This is one reason why the optocouplers with a higher operating voltage have lower CTRs. Thus, it is beneficial to set the distance between the LEDs and the photo-diodes to be no larger than necessary (e.g. minimum distance) to protect the low voltage circuit from the high voltage jumps.

In FIGS. 6 and 7 the optical cavity composes the body of the optocoupler. Light from the LEDs illuminates everything in the optical cavity including the diode's active region and other areas of the diode body that are inactive (metal end caps, electrical leads, etc.) which leads to lower CTR. This is shown in FIG. 7 where the light emitted from LEDs 702 and 704 not only impinge on the active region of diodes 402-412, but also end caps 414/416 and leads 418/420. In addition, light that hits the optical cavity walls is also lost unless the optical cavity is coated with a reflective material, and then a fraction of the light is still lost. This lost light reduces the optocoupler efficiency. Optical efficiency is essentially the difference between the light emitted from the sources and the light received by the detectors. Furthermore, even if the cavity has a reflective layer, the cavity shape also has an effect on efficiency. For example, cavity 700 in FIG. 7 is rectangular and includes corners. Even if cavity 700 included a reflective layer, light beams would become trapped in the corners where they reflect back and forth a number of times thereby becoming weaker (i.e. each reflection in the cavity makes the light beam weaker). Optimally, the design should minimize the number of reflections of a light beam before the light beam impinges on the diodes stack.

As can be seen in FIG. 7, light beams emitted by LEDs 702 and 704 become incident on the photo-diodes 402-412. However, certain photo-diodes (e.g. 402, 404, 410 and 412), which are directly in front of the LEDs, may receive more light than other diodes (e.g. 406 and 408) that are positioned indirectly with respect to the LEDs. This is problematic in conventional optocouplers, because very little light, if any, is reflected by the transparent optical cavity towards these indirectly positioned photo-diodes. This creates what are known as "hot spots" where some photo-diodes (e.g. 402, 404, 410 and 412) receive more light than others (e.g. 406 and 408).

Hot spots can be problematic, because the photo-diode's ability to conduct electrical current through the high voltage circuit is proportional to the amount of light impinging on them. Thus, the photo-diodes (e.g. 402, 404, 410 and 412) that are directly in front of the LED may be fully conductive, whereas the photo-diodes (e.g. 406 and 408) that are not directly in front of the LEDs receive less light are only partially conductive.

Problems associated with hot spots may be further exacerbated by the fact that the photo-diodes are electrically connected in series, and the total amount of electrical current able to flow through a series connection is limited to the least conductive of the photo-diodes in the stack. For example, if some (e.g. 402, 404, 410 and 412) of the photo-diodes receives direct light, it may become fully conductive having the capability to conduct 'C' amps of current. However, if the other photo-diodes (e.g. 406 and 408) are only receiving indirect light, then it may only by half conductive having the capability to conduct C/2 amps of current. Due to the series connection between the three photo-diodes, the maximum current that can flow through the optocoupler will be C/2 amps, which may be insufficient for the given application.

One solution to this hot spot problem is the use of a reflective layer for improving what is herein referred to axial uniformity (e.g. the uniformity of light received across all the photo-diodes in the stack). As described above, the LEDs and photo-diodes are molded using a clear material. This provides a medium for light to travel between the LEDs and the photo-diodes. To ensure that all of the photo-diodes (e.g. even the diodes indirectly positioned relative to the LEDs) receive a similar amount of light, the optocoupler is coated with a reflective material having a high level of reflectance (e.g. >90%).

For example, the molded optical cavity 700 (once cured) may be inserted into a second mold which is then filled with a reflective material. This reflective material encapsulates the optical cavity and provides a surface that reflects the light beams emitted by the LEDs back to the photo-diodes. The reflective material may allow both the specular reflection (e.g. light beam is directly reflected in a single direction) and diffuse reflection (e.g. light beam is diffused in many directions) of the light beams.

For example, assume that cavity 700 of the optocoupler in FIG. 7 includes a reflective layer (not shown) encapsulating the optical cavity 700. The reflective layer reflects light beams emitted from LEDs 702 an 704. As the LEDs emit these light beams, the reflective layer reflects the light beams one or more times so that the light is uniformly diffused throughout the optical cavity. Thus, even the photo-diodes that are indirectly positioned relative to the LEDs receive an adequate amount of light due to these reflections.

As described above, the reflective layer ensures that light beams attempting to exit the optical cavity are reflected back into the optical cavity towards those photo-diodes that may not receive direct light from the LEDs. This configuration is beneficial in avoiding the so called hot spots (e.g. conditions in which some photo-diodes don't receive enough light).

Figure 8:
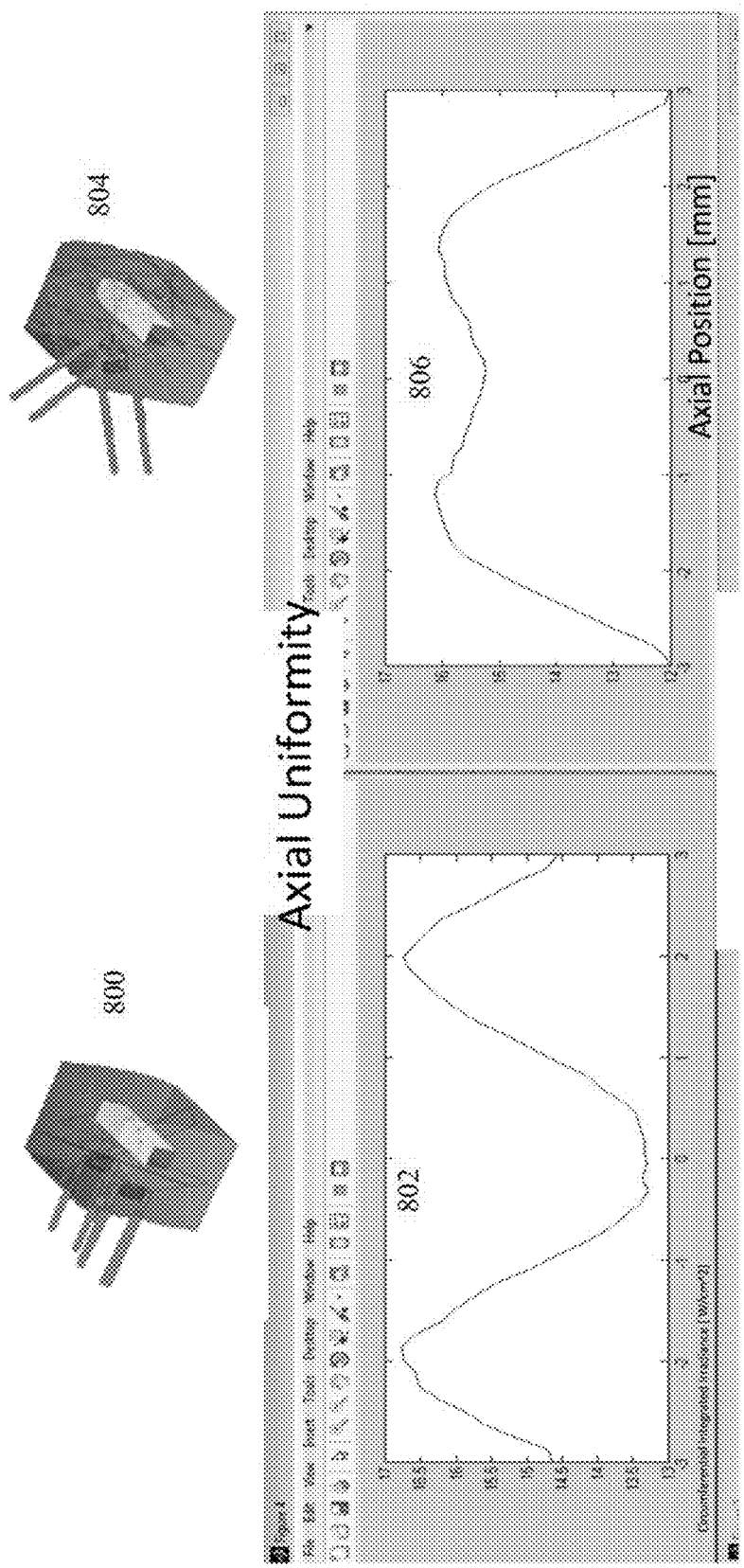
FIG. 8 shows a comparison of axial uniformity between optocouplers with a reflective coating, one without optimized placement of the light sources (optocoupler 600) and a modified version with optimized placement of the light sources, according to an embodiment of the present invention.

Shown in FIG. 8 is an optical comparison between received light in a cube shaped optocoupler 800 that relies on direct illumination and a cube shaped optocoupler 804 that relies on direct and indirect illumination. In both cases, there is a reflective layer around the optical cavity. More specifically, data plots 802 and 806 show a comparison of light irradiance (e.g. how much light a photo-diode receives) versus axial position within the optical cavity (e.g. the photo-diode position relative to the LEDs).

As shown in data plot 802, were the LEDs are oriented directly at the detector, the irradiance is not uniform. The reflective layer sees a small portion of the light from the LEDs and scatters it back to the detector while most of the light from the LEDs directly impinges on the detector. For example, the photo-diode positioned at axial position 0 (e.g. positioned indirectly with respect to the LEDs) receives significantly less light than the photo-diodes positioned at axial positions −2 and 2 (e.g. positioned directly in front of the LEDs). This is an indication of hot spots due to non-uniform distribution of light.

In contrast, as shown in the data plot 806, where the LEDs point indirectly at the light detector, the irradiance becomes more uniform. For example, the photo-diode positioned at axial position 0 (e.g. positioned indirectly with respect to the LEDs) receives almost the same amount of light as the photo-diodes positioned at axial positions −2 and 2 (e.g. positioned directly with respect to the LEDs). This is due to larger amount of light scattering off the reflective layer.

In many cases, it may not be acceptable to mount the light sources at oblique angles as shown in 804. Instead, the shape of the optical cavity in conjunction with a reflective layer, can improve the optocoupler's optical efficiency. An example of an optical cavity that accomplishes this is shown in FIGS. 9A-9C.

Figure 9B:
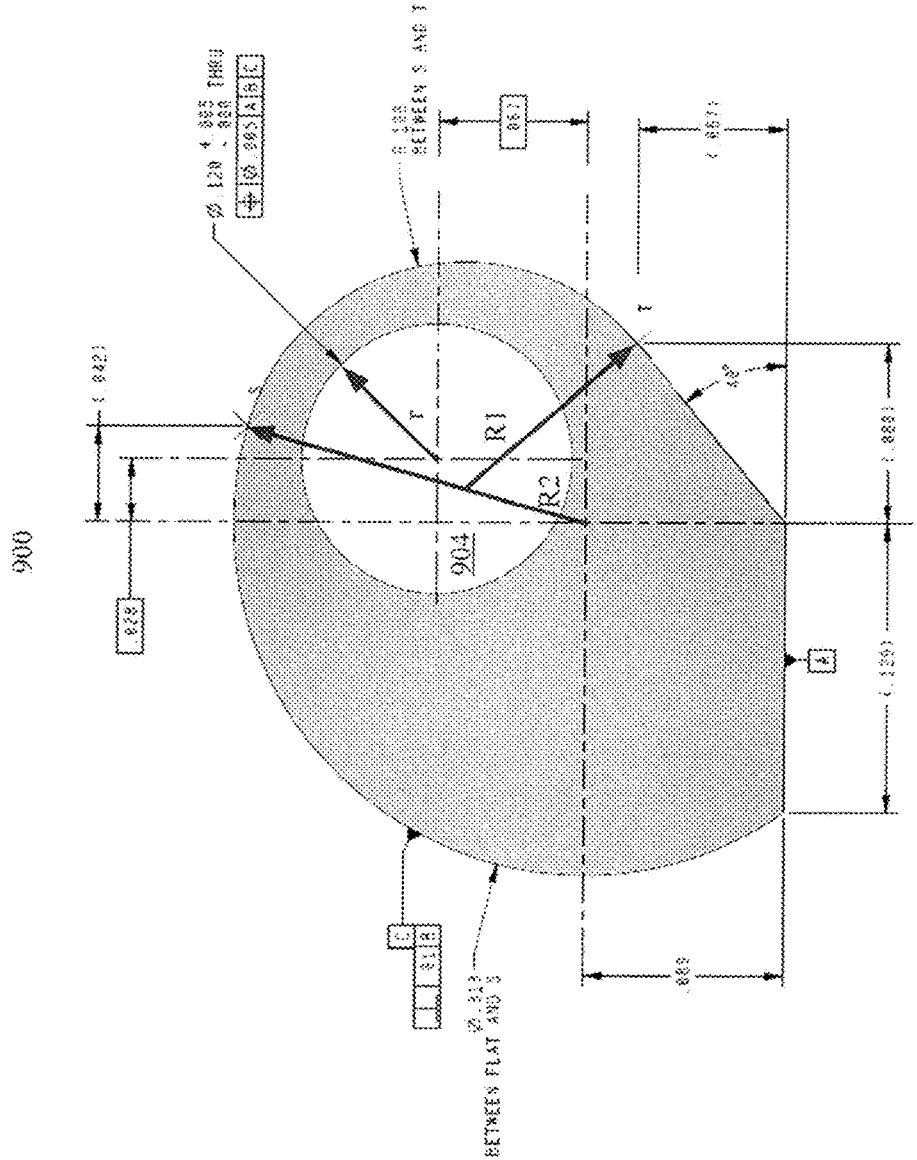
FIG. 9B shows a side view illustration of the optical cavity in FIG. 9A, according to an embodiment of the present invention.

In one example, optocoupler 900 is shown in FIG. 9A to have a curved shape to better reflect the light beams. Specifically, optocoupler 900 includes LEDs 906 and 908, cylindrical cavity 904 for inserting or molding the photo-diode stack (not shown) therein, and a body 902 with a curved upper surface. Although the curved upper surface as depicted in FIG. 9A has an asymmetrical, comma-like geometry, the curved shape may also be symmetrical. A side view of optocoupler 900 is shown in FIG. 9B, and a bottom view of optocoupler 900 is shown in FIG. 9C. As illustrated in FIG. 9B, the radius (r) (e.g. 0.06 in.) associated with the photo-diode stack cavity 904 is smaller than the radius of curvature (R) (e.g. 0.1 in.) of the portion of the optocoupler cavity adjacent the photo-diodes in the stack positioned furthest from the light sources along a path of travel for incident light from the sources (i.e. those to which the light must take the longest path to reach, and which do not lie directly in the path of any light beams emitted from the sources), and the two radii (r) and (R) emanate from different, parallel center axes. In the example shown in FIG. 9B, the center axis of the radius (r) for the photo-diode stack cavity and center axis of the radius (R) of the optocoupler cavity curved portion define a plane that bisects the optical cavity into unequal portions. By contrast, in each of the embodiments depicted in, e.g., FIGS. 9B and 10B, the respective axes lie on a plane that bisects the optical cavity into equal portions. In the comma-shaped geometry depicted in FIG. 9B, the rightmost portion of the optocoupler cavity curved portion has a radius (R1) that intersects (at point T) with a 40 degree line emanating from the base (bottom surface) of the optocoupler shape on one side, and intersects with a curve having a radius (R2) (e.g. 0.1565 in.), which is larger than (R2) and (r), which defines the leftmost portion of the optocoupler cavity curved portion, and which connects to the other side of the base. The center axes for (R1), (R2) and (r) are parallel to one another (but each pair defines different planes), the center axis for (R1) intersects with radius (R2), and the center axis for (r) intersects with radius (R1). Although depicted in some of the figures shown to scale with exemplary dimensions, the invention is not necessarily limited to embodiments having any specific dimensions. In the embodiments depicted in FIGS. 9B, and 10B, the curved portion of the cavity having the radius (R) (see, e.g., FIG. 10B) intersects with straight lines perpendicular to and emanating from the base. The optocoupler is not limited to any particular geometry, as long as a significant amount of the light produced by the LEDs either directly or through one reflection uniformly illuminates the active region of the detector.

In the embodiment depicted in FIG. 10A, optical cavity 1000 geometry includes the semi-circular cylinder (half-disc) shape mounted atop a right rectangular prismoidal portion. Optical cavity 1000 includes two cavities 1004 and 1006 on the bottom surface for inserting/molding the LEDs therein, and a cylindrical cavity 1002 for inserting/molding the photo-diode stack. The semi-circular shape along with the placement of the LEDs on either side of the photo-diode stack produces a uniform light distribution along the length of the photo-diode stack.

Figure 10B:
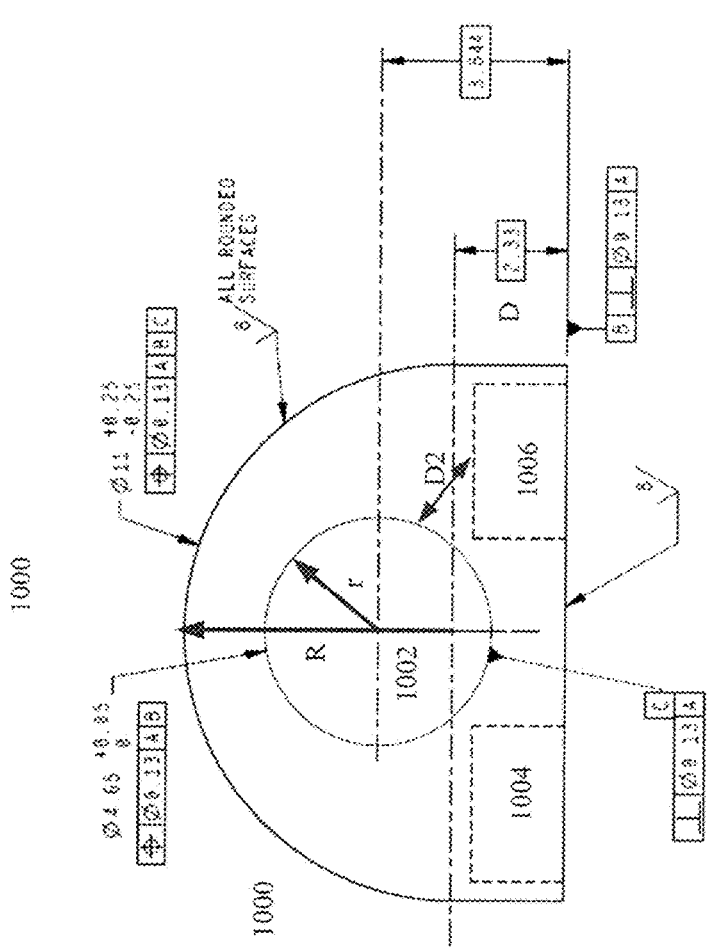
FIG. 10B shows a side view illustration of the optical cavity in FIG. 10A, according to an embodiment of the present invention.

FIG. 10B shows the distance D2 from the LEDs to the body of the photo-diode. This distance is determined by the dielectric strength of the optical material and maximum operating voltage of the device.

Figure 10C:
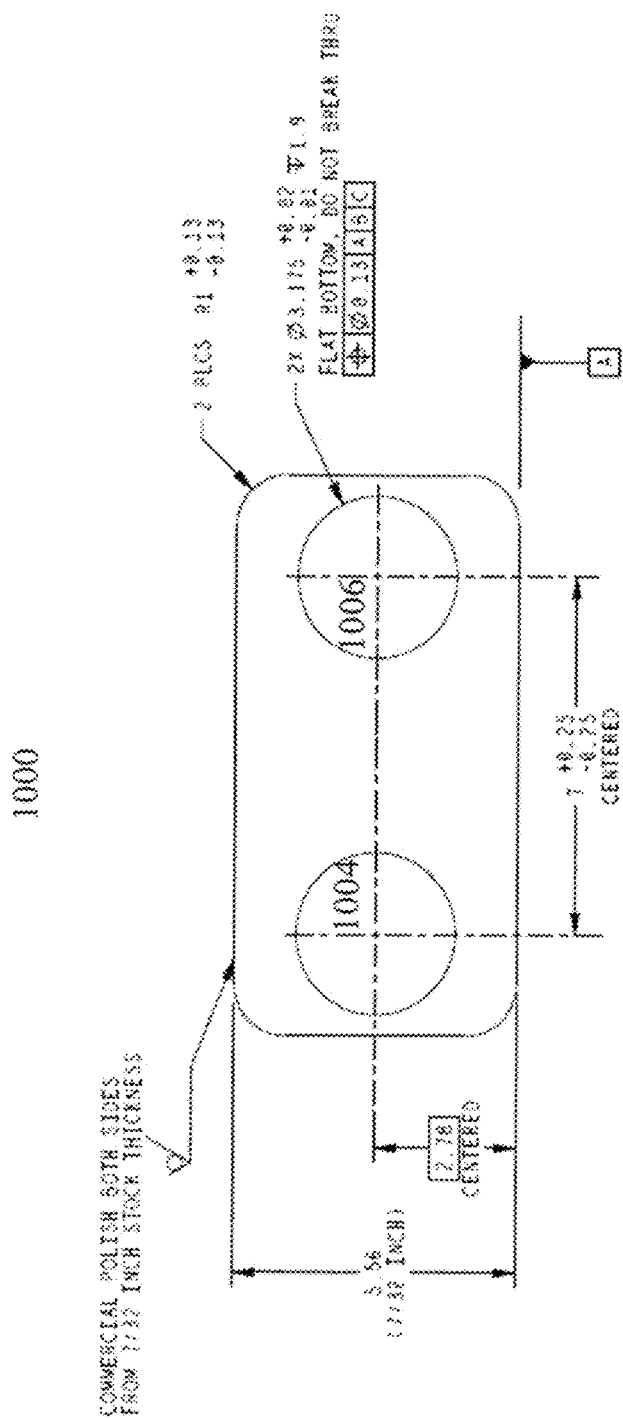
FIG. 10C shows a bottom view illustration of the optocoupler in FIG. 10A, according to an embodiment of the present invention.

The width of the optical cavity as shown in FIG. 10C is set to be just long enough to accommodate the active region on the photo-diode. Leaving the end caps and leads outside of the optical cavity. This improves the efficiency by limiting the light to just the active region of the photo-diodes (e.g. light is directed to the photodiodes in the stack).

Figure 11B:
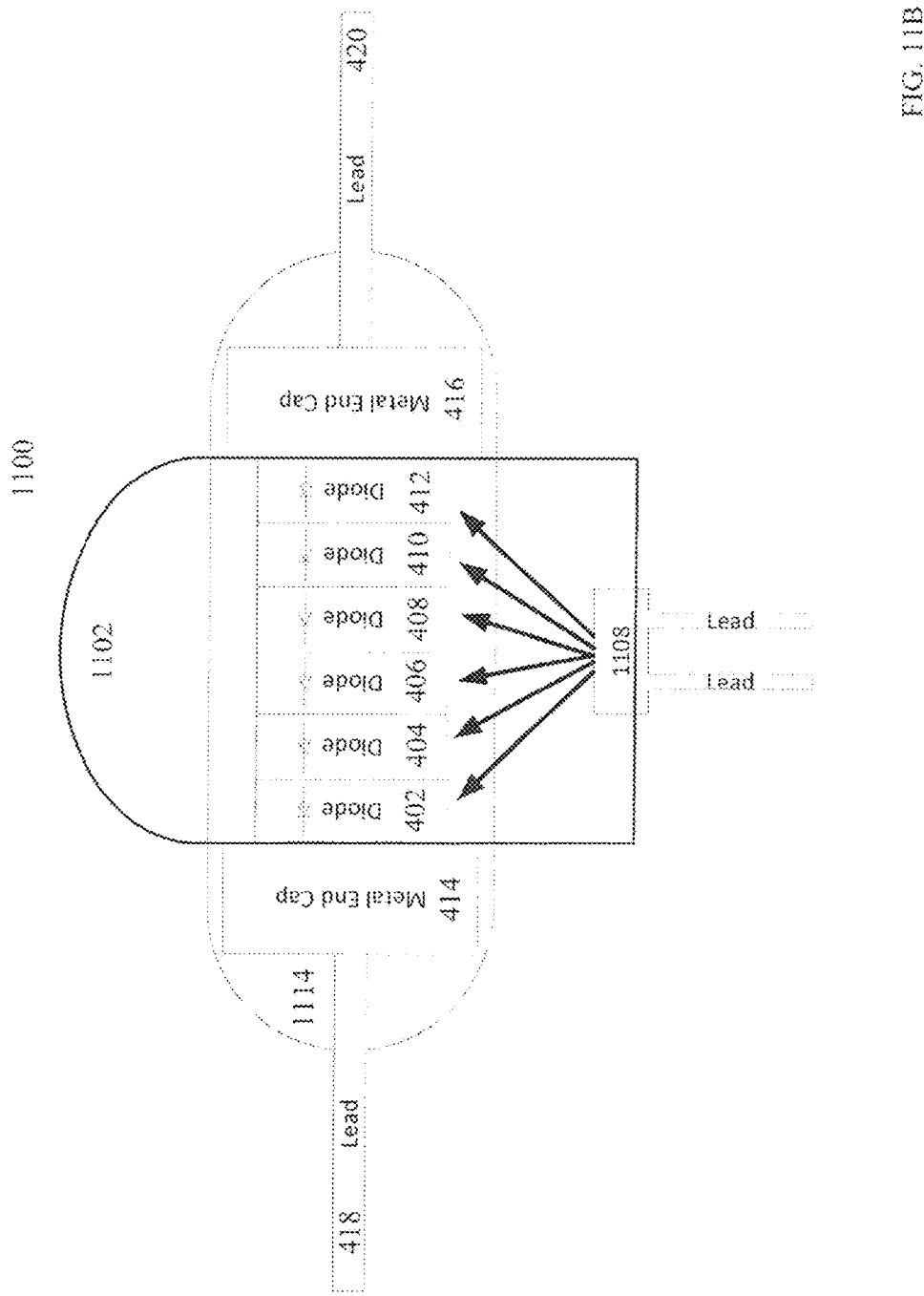
FIG. 11B shows a schematic view illustration of the optocoupler in FIG. 11A, according to an embodiment of the present invention.

FIGS. 11A and 11D show perspective views of the optical cavity along with the photo-diode and LEDs. FIG. 11B shows a schematic view of the assembly highlighting that the optical cavity width is less than the photo-diode overall length. The assembly shown in FIGS. 11A and 11B would then be encased in a diffuse reflective material with similar dielectric strength as that of the optical cavity to complete the optocoupler. For example, optical cavity 1102 is shown to bring the LEDs 1108 closer to the photo-diode stack and exclude the metal end caps and diode leads (e.g. the inactive regions). In this configuration, the body of the LED 1108 itself is also minimized in the cavity (e.g. only the light emitting surface of the LED is located in the optical cavity 1102, thereby decreasing the inactive regions). Essentially, optical cavity 1102 partially covers the LEDs and photo-diodes such that the active regions (light receiving diode stack surface and LED light emitting surface) are enclosed in optical cavity 1102, while inactive regions (electrical leads and end caps) are not enclosed in optical cavity 1102 (e.g. they protrude from optical cavity 1102).

Optocoupler 1100 in FIG. 11A includes LEDs, Photo-diodes, and has a semi-circular cylinder (half-disc) shape. This half-disc shape may be desirable because it provides a rounded reflective surface that is more uniformly radially spaced from the detectors to more uniformly return light toward the detectors. This configuration increases optical efficiency (e.g. light is more uniformly diffused throughout the cavity). Although a rounded shape may be most efficient in some designs, any geometry, including a curved surface that is not rounded or spherical (e.g. parabolic), and including an angled surface or a plurality of polygonal surfaces ranging from a single polygonal face to a collection of polygonal faces that approximates a rounded surface, may enhance optical efficiency sufficiently relative to a design without such surfaces by reflecting light along a desired trajectory. Ideal geometries create at least one indirect light path from the light source to the optical detector with only a single reflection point.

Figure 11C:
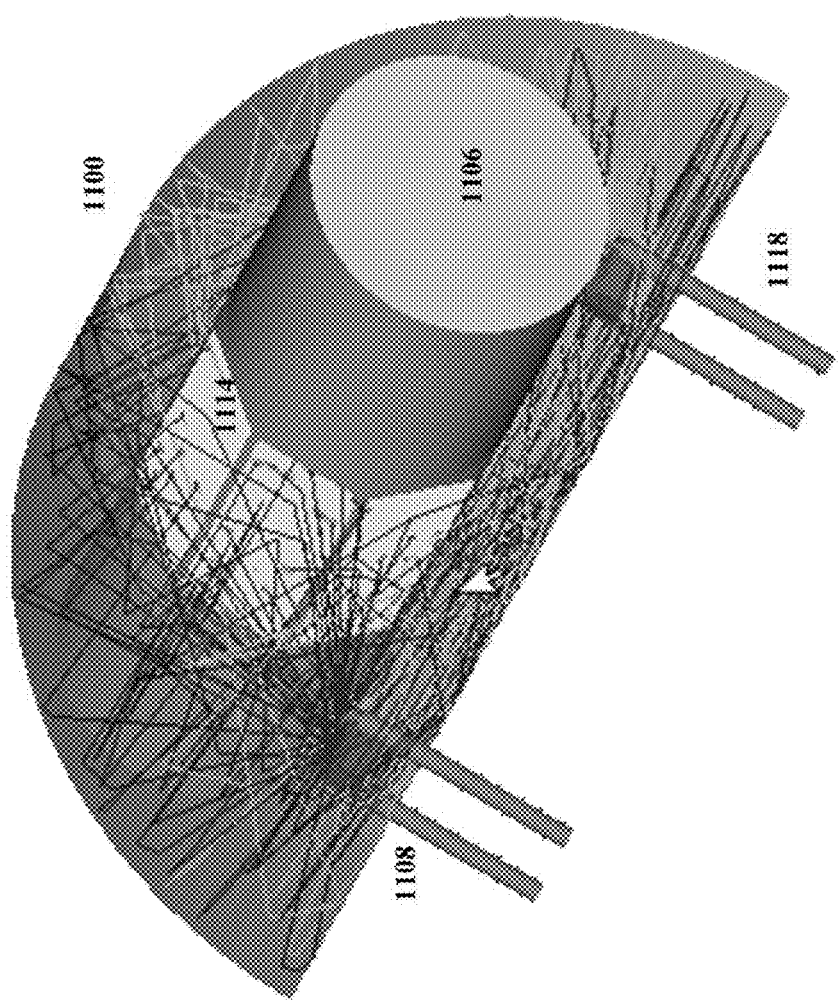
FIG. 11C shows the light emitted by the light sources in the optocoupler of FIG. 11A, according to an embodiment of the present invention.

FIG. 11C shows a model of the light being reflected inside the optical cavity 1102. In this model, it is shown that the light emitted from LEDs 1108 and 1118 impinges directly and indirectly on the active diode stack region 1114. Indirect light is produced by light beams reflecting from the reflective coating on cavity 1102. The number of reflections is also minimized due in part to the curved geometry (half-disc shape) of the cavity 1102. These factors increase efficiency in the optocoupler while avoiding hot spots.

In one example, the optical cavities (e.g. 1102) represent volumes formed in a molding process, where the photo-diode stack and LEDs may be installed after the mold is cured. In another example, these cavities represent volumes in the optocoupler where the photo-diode stack and LEDs are molded directly into the optical cavity such that active regions (light receiving diode stack surfaces and LED light emitting surfaces) are enclosed in optical cavity 1102, while inactive regions (electrical leads and end caps) are not enclosed in optical cavity 1102 (e.g. they protrude from optical cavity 1102).

Figure 11E:
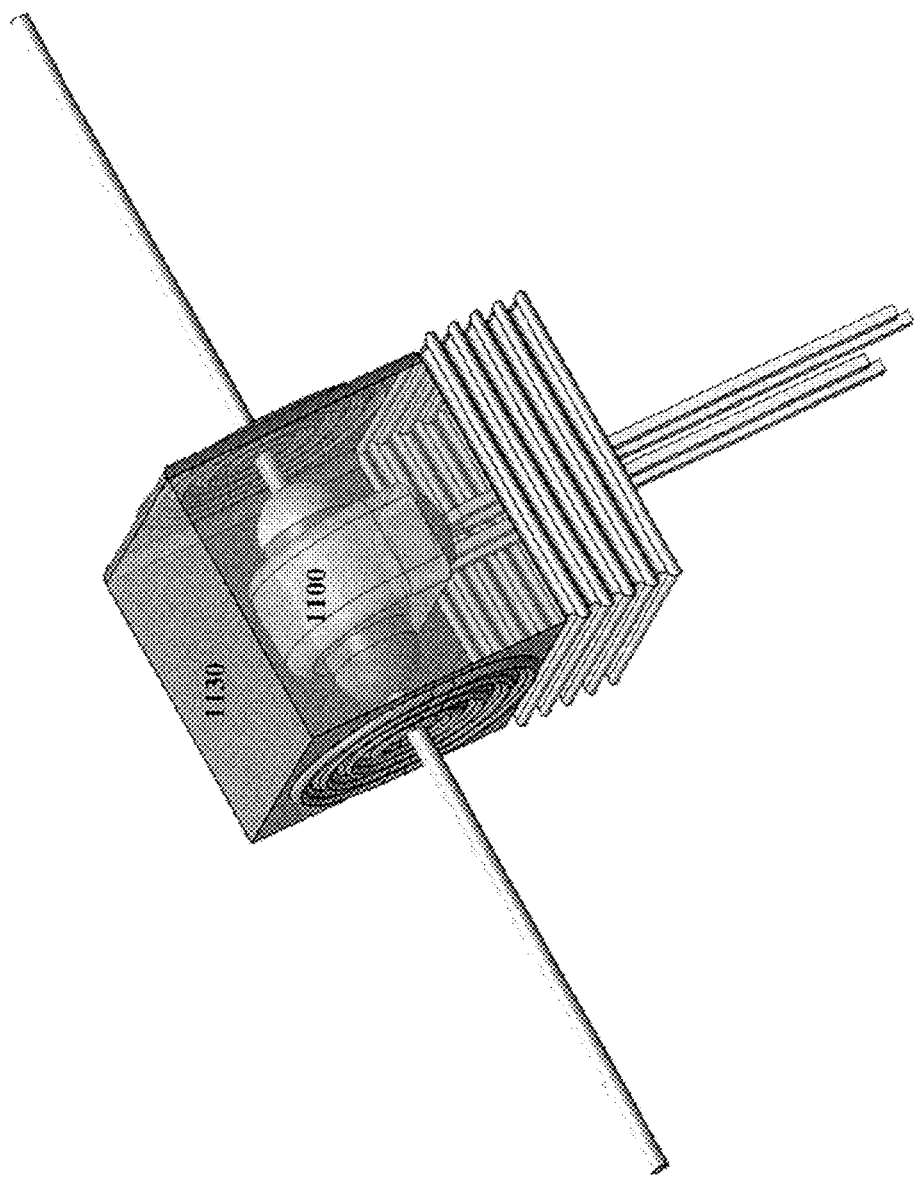
FIG. 11E shows a perspective view illustration of the optocoupler in FIG. 11D enclosed in a high voltage cavity.

FIG. 11E shows another perspective view of optocoupler 1100 in FIGS. 11A and 11D. In FIG. 11E, however, optocoupler 1100 is installed in a high voltage structure 1130. Structure 1130 protects optocoupler 1100, while allowing the leads of the diode stack and the LEDs to protrude for electrical connections to other devices. This configuration may be beneficial for installing optocoupler 1100 into a larger system.

FIG. 11E also shows features, incorporated into the encasing mold, that minimize electrical creepage, an important consideration of high voltage circuitry.

In general, optocoupler 1100 is designed to increase efficiency by one or more of the following: 1) limiting the overall optical cavity size to only include the active photo-diode stack regions and the active light emitting LED surfaces (e.g. electrical leads and end caps are not in the optical cavity) 2) covering the optical cavity in a coating that promotes both reflected and scattered light, 3) using a geometry that is conducive to minimizing a number of reflections required by a beam of light before impinging on the photodiode stack, and 4) positioning the LEDs with respect to the diodes stack to maximize axial uniformity over the stack.

Figure 12:
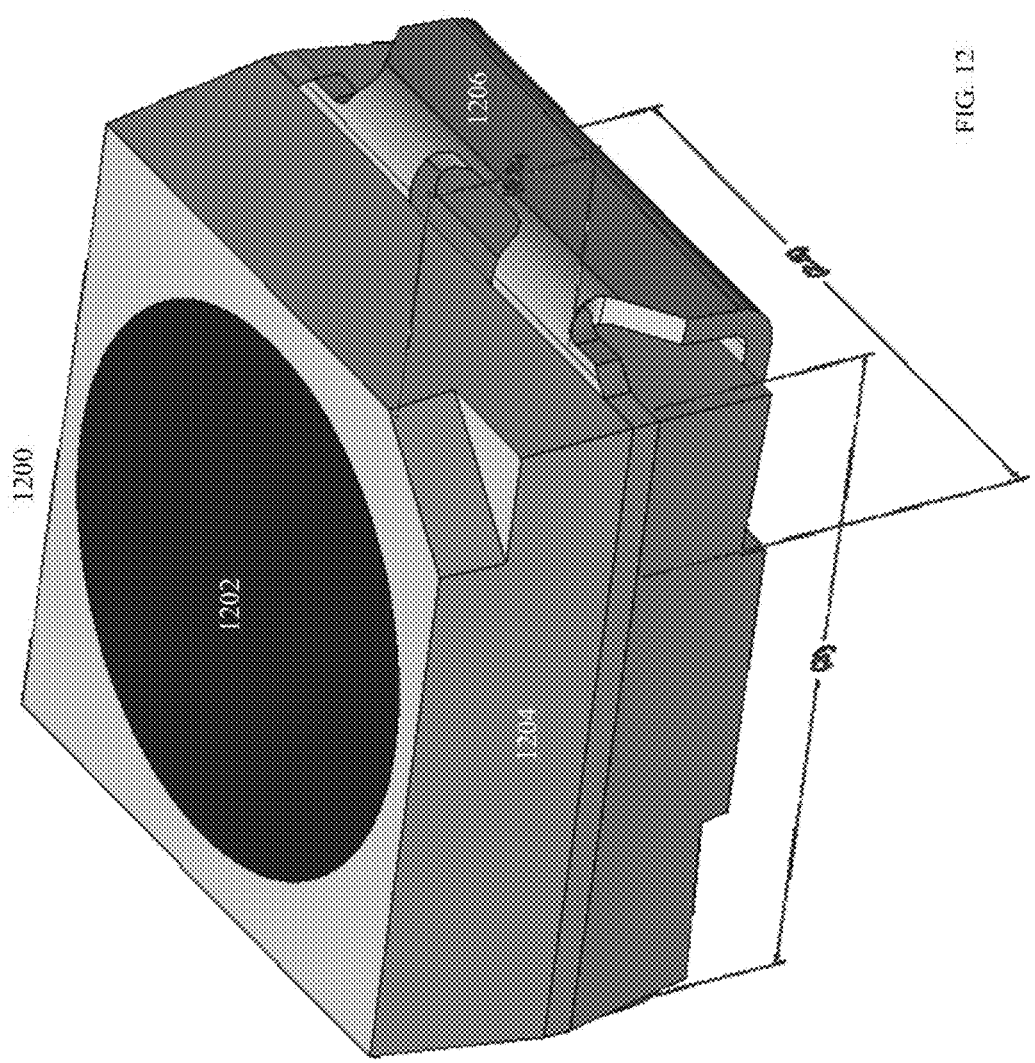
FIG. 12 shows a perspective view illustration of an exemplary light source configured for installation in the optocoupler, according to an embodiment of the present invention.

The types of LEDs used in these optocouplers may vary in size and shape based on the LED design, and may include LEDs that emit light in various spectra (visible spectrum, infrared spectrum, etc.). An example of a compatible LED for installation in the optocouplers (e.g. optical cavity 1000 in FIG. 10A) is shown in FIG. 12 as LED 1200. In this example, LED 1200 includes a substantially cubic body 1204, a light emitting surface 1202, a first external electrical lead 1206, and a second external electrical lead (not shown).

Figure 13:
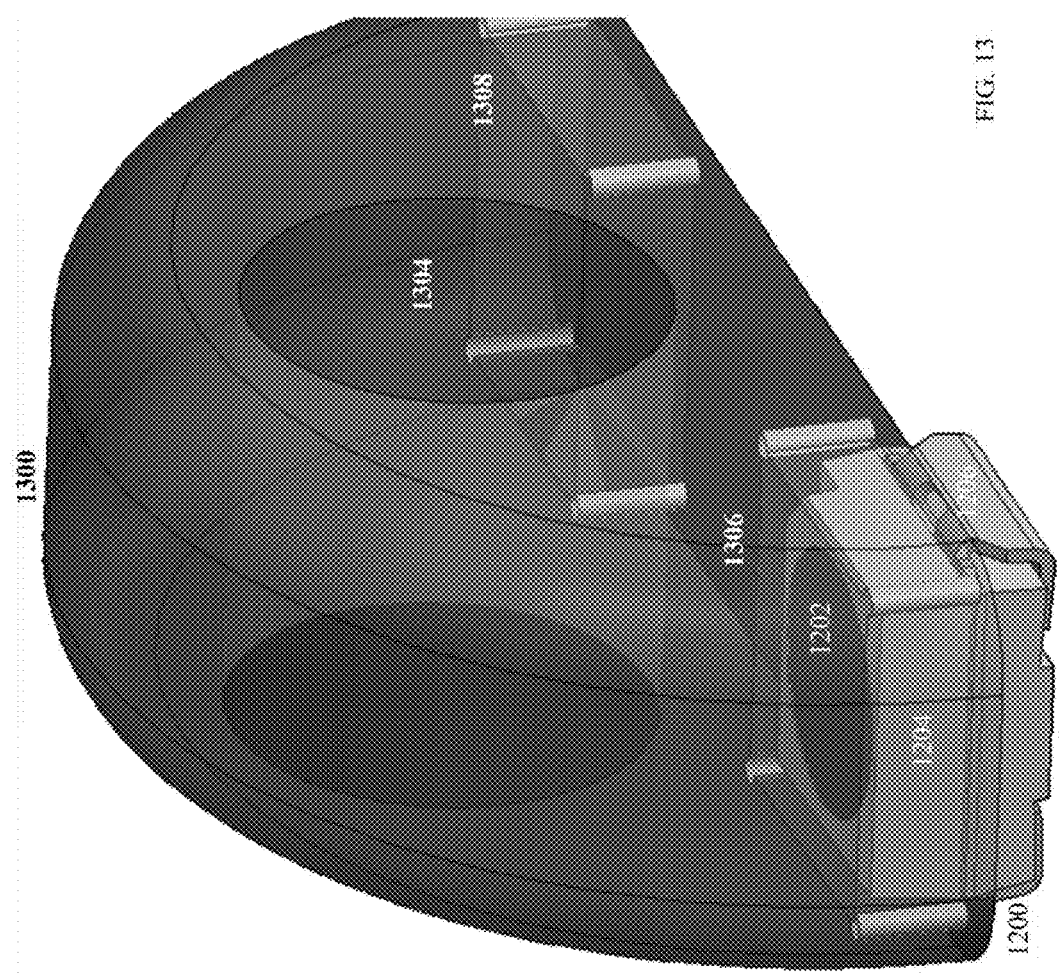
FIG. 13 shows a perspective view illustration of the exemplary light source in FIG. 12, mounted in an optical cavity similar to FIG. 10A, according to an embodiment of the present invention.

The above described LED configuration allows the LED to be inserted or molded into the optical cavity. An example of the LED inserted or molded into optical cavity 1100 is shown in FIG. 13 which depicts a cross sectional view of a portion of the optocoupler 1300 having optical cavity portion 1304, and LED receptacles 1306 and 1308 where the LEDs are inserted or molded. LED 1200 from FIG. 12 is shown installed in LED receptacle 1306 of optocoupler 1300. Note that LED 1200 is mounted/molded into optocoupler 1300 to minimize the amount of LED body 1204 (inactive region) that is included in the cavity, thereby increasing efficiency.

As described above, the optocoupler includes light sources and a light detector mounted or molded in an optically clear material at the wavelength of the light sources to form an optical cavity. To improve optical efficiency, the optical cavity is encapsulated in a reflective layer. An example of an optocoupler having these two layers is shown in FIG. 14.

Figure 14:
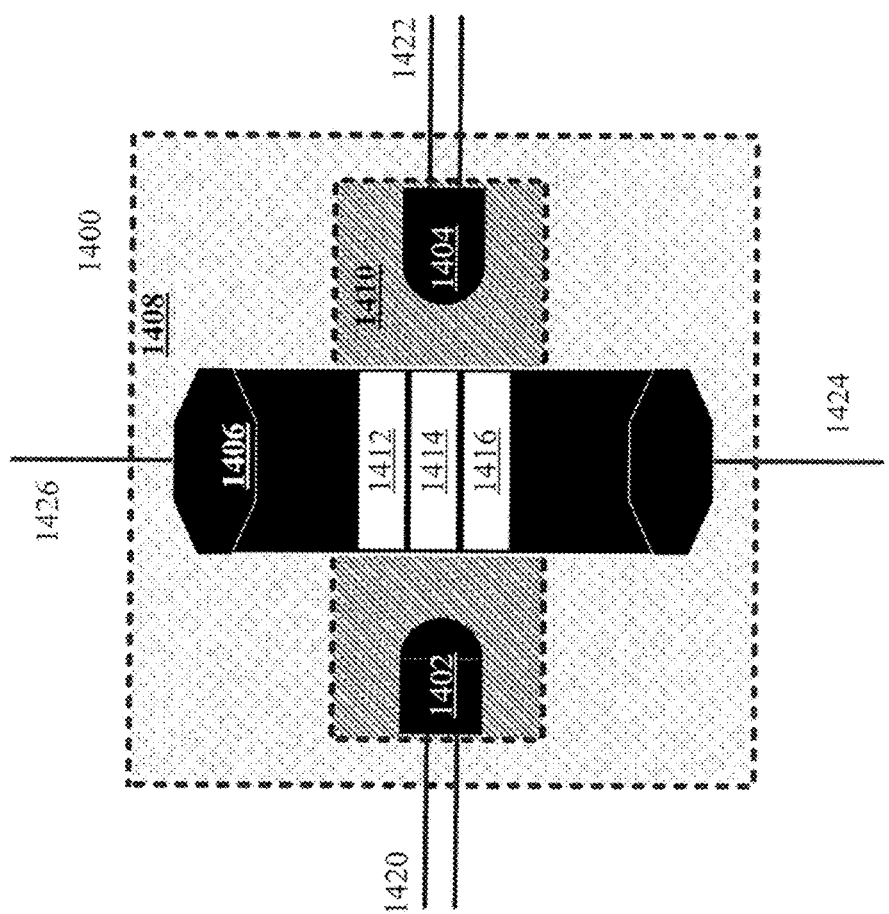
FIG. 14 shows a cross sectional view illustration of an exemplary manufactured optocoupler molded in two layers, according to an embodiment of the present invention.

FIG. 14 shows a 2-dimensional side view of a 3-dimensional cube shaped optocoupler 1400 having an optical cavity 1410, LEDs 1402 and 1404 with leads 1420 and 1422, and photo-diode stack 1406 having leads 1424 and 1426 and having multiple photo-diodes 1412, 1414 and 1416 positioned in a stack configuration. Thus, all of the photo-diodes in stack 2006 are evenly spaced along the axis of the stack. In addition, optocoupler 1400 has a reflective layer 1408 completely encapsulating optical cavity 1410.

Optocoupler 1400 shown in FIG. 14 may be manufactured by a two stage molding process. This process is described in detail in FIG. 15. In steps 1502 and 1504 the LEDs 1402/1404 and photo-diode stack 1506 are positioned within a mold (not shown). The mold may be a three dimensional cast mold that includes mounting positions where the bodies of the LEDs and photo-diodes can be secured in place within the mold, while allowing their respective electrical leads 1420-1426 to protrude to the outside of the mold.

In a first molding step 1506, a clear material such as a clear epoxy is poured into the mold and then oven cured in step 1508. Once the epoxy has cured, an electrical test is performed on the LEDs and photo-diodes in step 1510. If the LEDs or photo-diodes fail the test, then the device is scrapped in step 1512. However, if the LEDs and photo-diodes pass the test, then a second molding process is performed in step 1514.

Specifically, the cured epoxy extracted from the first mold is inserted into a second mold which also allows the electrical leads 1420-1426 of the LEDs and photo-diodes to protrude from the mold. A reflective material, such as but not limited to a mixture of epoxy and titanium dioxide is then poured into the second mold to encapsulate the cured clear material (e.g. silicon) and allowed to oven cure in step 1516. Once this second oven-curing procedure is complete, the LEDs and photo-diodes are once again electrically tested in step 1518. If the LEDs or photo-diodes fail the test, the device is scrapped in step 1520. However, if the LEDs and photo-diodes pass the test, the device is deemed to be good product in step 1522 and is packaged for sale to consumers.

In an alternative manufacturing process, the LEDs and photo diodes may be mounted in the optocoupler after the molding process. For example, the first mold may include a shape that creates cavities for installation of the LEDs and photo-diodes. The optocoupler may be molded with the clear epoxy, and then the reflective epoxy in a two-step process similar to that described in FIG. 15. However, the LEDs and photo-diodes may not be inserted into the molds (e.g. the LEDs and photo-diodes may be mounted into cavities formed during the molding process).

The optocoupler design increases the CTR for a given operating voltage by optimizing the optical efficiency and axial uniformity of the optical power. Optical efficiency is the ratio of the optical power hitting the light detector (i.e. diode-stack) versus the optical power emitted by all the light sources (i.e. LEDs). The axial uniformity of light received by the detectors is computed as (min_intensity/max_intensity)*100), where max_intensity is the maximum intensity of light received by one of the diodes (e.g. diode receiving direct light) in the stack, and min_intensity is the minimum intensity of light received by one of the diodes (e.g. diode receiving reflected light) in the stack. For example, the optocoupler may be designed to achieve an optical efficiency of EFF>50% for a given input of 140 mW of optical power, and a uniformity U>85%.

To achieve the desired CTR, the optocoupler design incorporates a number of design factors. A first factor is the optical cavity volume. For example, the design may minimize the optical cavity volume such that light has no paths that do not lead to the detector either directly or through a single reflection. A second factor is the placement of the LED with respect to the detector which maximizes the axial uniformity of the light hitting the detector by using a combination of direct and indirect (single reflection) lighting. A third factor is ensuring the high reflectance surface is both highly reflective (e.g. preferably >80% reflectivity, or more preferably at least 90%), and causes diffusion so that it scatters the light in an even pattern. A fourth factor is to exclude or minimize inactive regions (e.g. metal end caps, leads, LED body, etc.) from the optical cavity.

In addition, an encapsulant (e.g. epoxy, plastics, silicon, ceramic) may be used to maintain adequate voltage isolation between the electronic components (e.g. leads). LEDs with an emission spectra wavelength, matched to the peak detector detection wavelength should be used. The encapsulant can also act as the reflective material and does not need to be applied in a separate operation.

Figure 15:
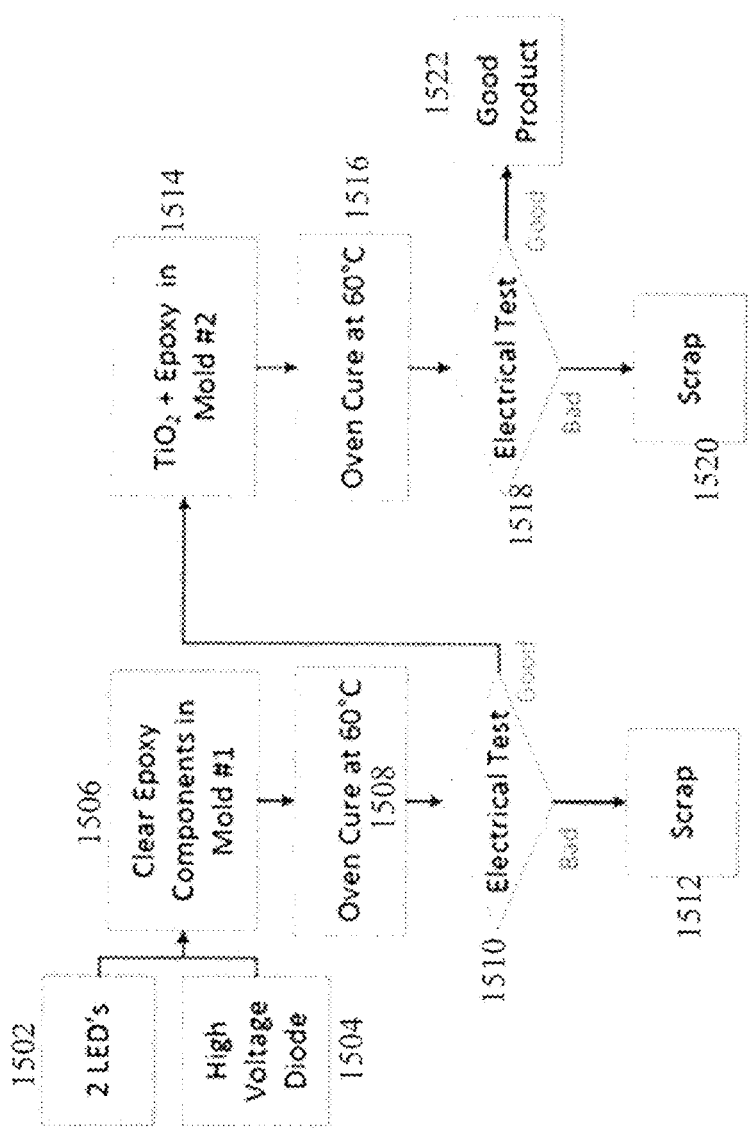
FIG. 15 is a flowchart of an exemplary optocoupler manufacturing process, according to an embodiment of the present invention.

Although manufacturing includes a second molding process for adding the reflective layer (as shown in FIG. 15), the reflective layer may be applied to the optical cavity surface by any method known in the art for applying a coating to a surface, including but not limited spray coating or other types of mechanical coating techniques, film coating (including shrink wrapping), vapor deposition processes, chemical or electrochemical techniques (including powder coating), and the like. For example, the cured optical cavity may be coated with a white coating, such as a layer of an acrylic white paint or any coating containing titanium dioxide or other reflective opacifier or combinations thereof, which acts as the reflective surface. Regardless of the type of coating step, it may be desirable to ensure the coating process leaves no uncoated regions or regions that are susceptible to flaking, pin holes, peeling, or other separation of the coating from the optical cavity, as uncoated regions will negatively impact performance. Using a second molding process step is ideal for avoiding uncoated spots. The optocoupler embodiments described throughout may be implemented in various high voltage devices. These devices include but are not limited to a mass spectrometer. In addition, the optocoupler may be controlled to modulate electrical current at various levels through the high voltage circuit based on the amplitude of the optocoupler input signal, or may be controlled as a binary switch which simply turns the flow of current ON and OFF through the high voltage circuit.

Figure 16:
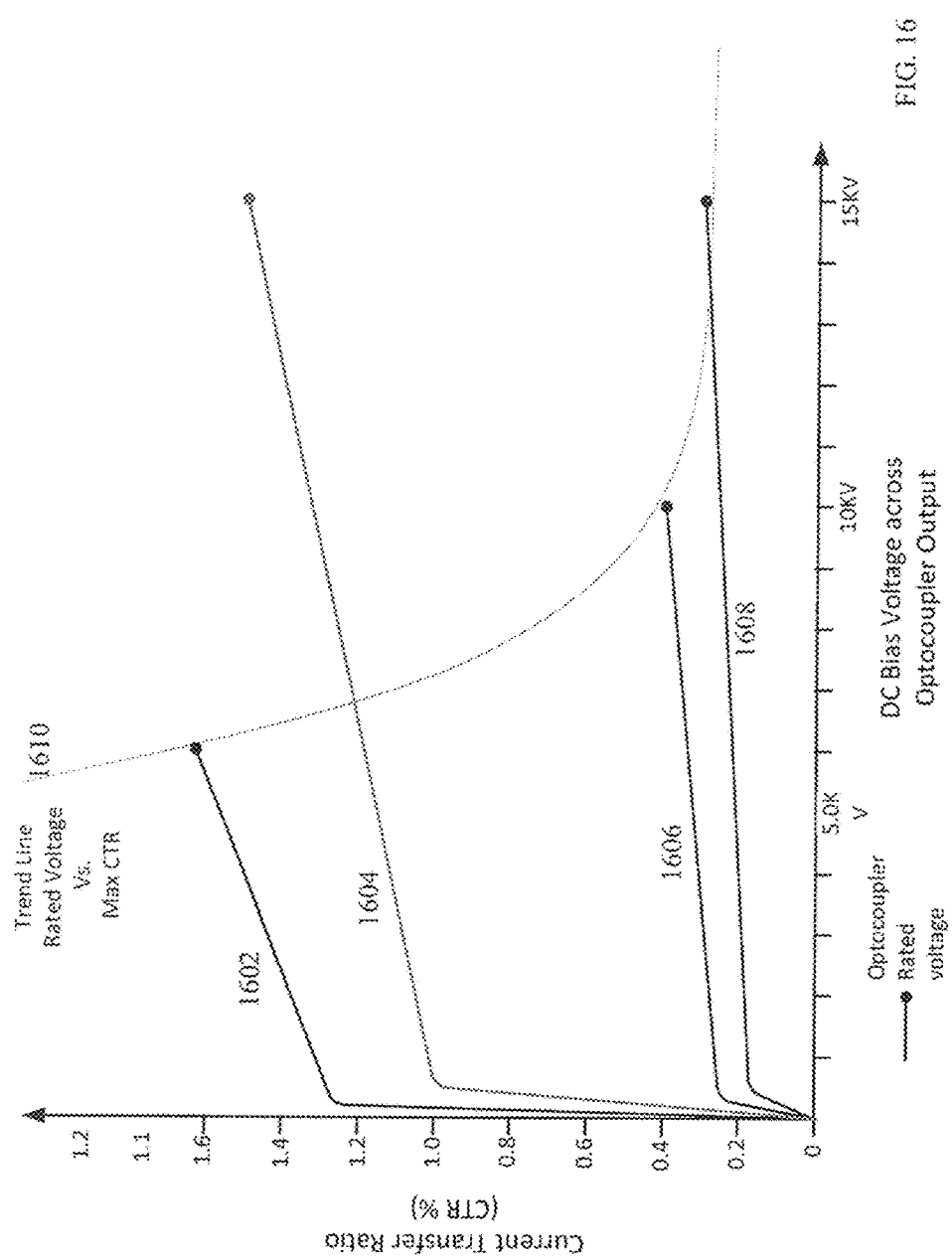
FIG. 16 is a representative graph comparing the CTR to the applied voltage across four optocouplers according to embodiment of the present invention.

FIG. 16 is a representative graph comparing the CTR to the applied voltage across four optocouplers. Data plots 1602, 1606, and 1608 show the performance of conventional 6, 10, and 15 KV optocouplers respectively. 1610 is the trend line rated voltage vs. max CTR for these optocouplers. This shows the inverse relationship between Rated Voltage and CTR. Data plot 1604 shows the performance of a 15 KV optocoupler according to the present invention. As shown by data plot 1604, the performance of a 15 KV optocoupler according to a present invention has much higher CTR than data plots 1606 and 1608 showing the performance of conventional 10 KV and 15 KV optocouplers.

Although the invention is illustrated and described herein with reference to specific embodiments, the invention is not intended to be limited to the details shown. Rather various modifications may be made in the details within the scope and range of equivalence of the claims and without departing from the invention.

The invention claimed is:

1. A method of manufacturing an optocoupler comprising:
    positioning a body of a light source into a first mold such that electrical leads of the light source protrude from the first mold;
    positioning a diode stack of a light detector into the first mold such that metal end caps and electrical leads of the light detector protrude from the first mold;
    pouring optically transparent material into the first mold to create an optical cavity enclosing the body of the light source and the diode stack of the light detector; and
    disposing a coating of optically reflective material over the optical cavity to form a reflective layer.

2. The method of claim 1, wherein the step of disposing the coating of optically reflective material over the optical cavity further comprises the steps of:
    placing the optical cavity into a second mold such that the electrical leads of the light source and the metal end caps and electrical leads of the light detector protrude from the second mold;
    pouring the optically reflective material into the second mold to create the reflective layer, wherein the reflective layer fully covers the optical cavity; and
    extracting the optocoupler from the second mold.

3. The method of claim 1, further comprising:
    positioning the body of the light source and the diode stack of the light detector a distance away from each other in the optical cavity before pouring the optically transparent material into the first mold, the distance selected to be greater than a distance corresponding to a dielectric breakdown strength of the optically transparent material at a design operating voltage of the optocoupler.

4. The method of claim 1, wherein the light detector comprises a plurality of photo-diodes, the method further comprising:
    providing the diode stack about an axis that intersects the optical cavity before pouring the optically transparent material into the first mold.

5. The method of claim 1, further comprising:
    selecting a shape for the optical cavity that achieves a predetermined uniformity and a predetermined efficiency of light received by the light detector.

6. The method of claim 1, further comprising:
minimizing a volume of the first mold by spacing the light source and the light detector based on a design operating voltage of the optocoupler, dielectric breakdown strength of the optically transparent material, and uniformity of light received by the light detector.

* * * * *